US012809271B2

(12) United States Patent
Murakami et al.

(10) Patent No.: US 12,809,271 B2
(45) Date of Patent: Nov. 24, 2026

(54) EXPOSURE APPARATUS

(71) Applicant: NIKON CORPORATION, Tokyo (JP)

(72) Inventors: Koichi Murakami, Kikuchi-gun (JP); Koutarou Takigami, Kikuchi-gun (JP); Tetsuya Abe, Kikuchi-gun (JP)

(73) Assignee: NIKON CORPORATION, Tokyo (JP)

( * ) Notice: Subject to any disclaimer, the term of this patent is extended or adjusted under 35 U.S.C. 154(b) by 614 days.

(21) Appl. No.: 18/361,066

(22) Filed: Jul. 28, 2023

(65) Prior Publication Data

US 2023/0367230 A1 Nov. 16, 2023

Related U.S. Application Data

(63) Continuation of application No. PCT/JP2021/003347, filed on Jan. 29, 2021.

(51) Int. Cl.
*G03F 7/00* (2006.01)
*G03F 7/20* (2006.01)

(52) U.S. Cl.
CPC ........ *G03F 7/70491* (2013.01); *G03F 7/2008* (2013.01); *G03F 7/70116* (2013.01); *G03F 7/70625* (2013.01)

(58) Field of Classification Search
CPC ............... G03F 7/2008; G03F 7/70116; G03F 7/70291; G03F 7/70358; G03F 7/70491;
(Continued)

(56) References Cited

U.S. PATENT DOCUMENTS 6,312,134 B1 * 11/2001 Jain ..................... G03F 7/70358 359/223.1
6,778,257 B2 8/2004 Bleeker et al.
(Continued)

FOREIGN PATENT DOCUMENTS

CN 110286562 A 9/2019
EP 1363166 A2 11/2003
(Continued)

OTHER PUBLICATIONS

Apr. 13, 2021 Written Opinion issued in International Patent Application No. PCT/JP2021/003347.
(Continued)

*Primary Examiner* — Peter B Kim
(74) *Attorney, Agent, or Firm* — Oliff PLC

(57) ABSTRACT

An exposure apparatus includes: light source that emits exposure light; exposure pattern forming apparatus including a plurality of exposure elements and disposed on an optical path of at least part of exposure light; and control unit electrically connected to exposure pattern forming apparatus, in which control unit controls whether workpiece is irradiated with exposure light via each of exposure elements by switching each of exposure elements to a first or second state, and integrates exposure amount in predetermined region of scheduled exposure region by sequentially irradiating predetermined region with light of part of exposure light via a first exposure element in first state among plurality of exposure elements and light of part of exposure light via second exposure element in the first state different from the first exposure element among the plurality of exposure elements in accordance with a relative movement of the workpiece and the exposure pattern forming apparatus.

27 Claims, 14 Drawing Sheets

(58) Field of Classification Search
CPC ............. G03F 7/70508; G03F 7/70558; G03F 7/70625
USPC ............................................................ 355/53
See application file for complete search history.

(56) References Cited

U.S. PATENT DOCUMENTS

| | | | |
|---|---|---|---|
| 7,170,584 B2 | 1/2007 | Derksen | |
| 10,522,329 B2 | 12/2019 | Platzgummer et al. | |
| 2007/0121437 A1* | 5/2007 | Nishikawa ............. | G11B 7/083 |
| 2008/0316458 A1 | 12/2008 | Sumi et al. | |
| 2019/0285988 A1 | 9/2019 | Osaka | |
| 2020/0089121 A1 | 3/2020 | Thallner et al. | |

FOREIGN PATENT DOCUMENTS

| | | |
|---|---|---|
| JP | 2004-304135 A | 10/2004 |
| JP | 2019-164238 A | 9/2019 |
| JP | 2020-502577 A | 1/2020 |

OTHER PUBLICATIONS

Jun. 2, 2025 Extended European Search Report issued in European Patent Application No. 21922911.9.
Mar. 26, 2024 Office Action issued in Japanese Patent Application No. 2022-577969.
Apr. 13, 2021 International Search Report issued in International Patent Application No. PCT/JP/2021/003347.
May 25, 2026 Office Action issued in Chinese Patent Application No. 202180092160.1.

* cited by examiner

EXPOSURE APPARATUS

CROSS-REFERENCE

This application is a U.S. national phase entry of International Application No. PCT/JP2021/003347 which was filed on Jan. 29, 2021, and the disclosure of international application no. PCT/JP2021/003347 is incorporated herein by reference in their entirety.

TECHNICAL FIELD

The present disclosure relates to the technical field of exposure apparatuses.

BACKGROUND ART

A photomask is used to manufacture, for example, a display panel of a display apparatus (e.g., a liquid-crystal display, an organic EL display, or the like) or an integrated circuit of a semiconductor device. As an example, an exposure apparatus that forms a desired exposure pattern on a workpiece in order to manufacture a photomask is known.

SUMMARY

An exposure apparatus of the present disclosure includes: a light source that emits exposure light; an exposure pattern forming apparatus disposed on an optical path of at least part of the exposure light; and a control unit electrically connected to the exposure pattern forming apparatus, in which the exposure pattern forming apparatus includes a plurality of exposure elements, at least one exposure element of the plurality of exposure elements is used to irradiate a scheduled exposure region of a workpiece with light of at least part of the exposure light, and the control unit controls whether the workpiece is irradiated with the exposure light via each of the exposure elements by switching each of the exposure elements to a first state or a second state, and integrates an exposure amount in a predetermined region of the scheduled exposure region by sequentially irradiating the predetermined region with light of part of the exposure light via a first exposure element in the first state among the plurality of exposure elements and light of part of the exposure light via a second exposure element in the first state different from the first exposure element among the plurality of exposure elements in accordance with a relative movement of the workpiece and the exposure pattern forming apparatus.

In the embodiment of the present disclosure, the plurality of exposure elements is two-dimensionally arrayed, and the first exposure element and the second exposure element are exposure elements different from each other in a same row among the plurality of exposure elements.

DESCRIPTION OF EMBODIMENTS

Figure 1:
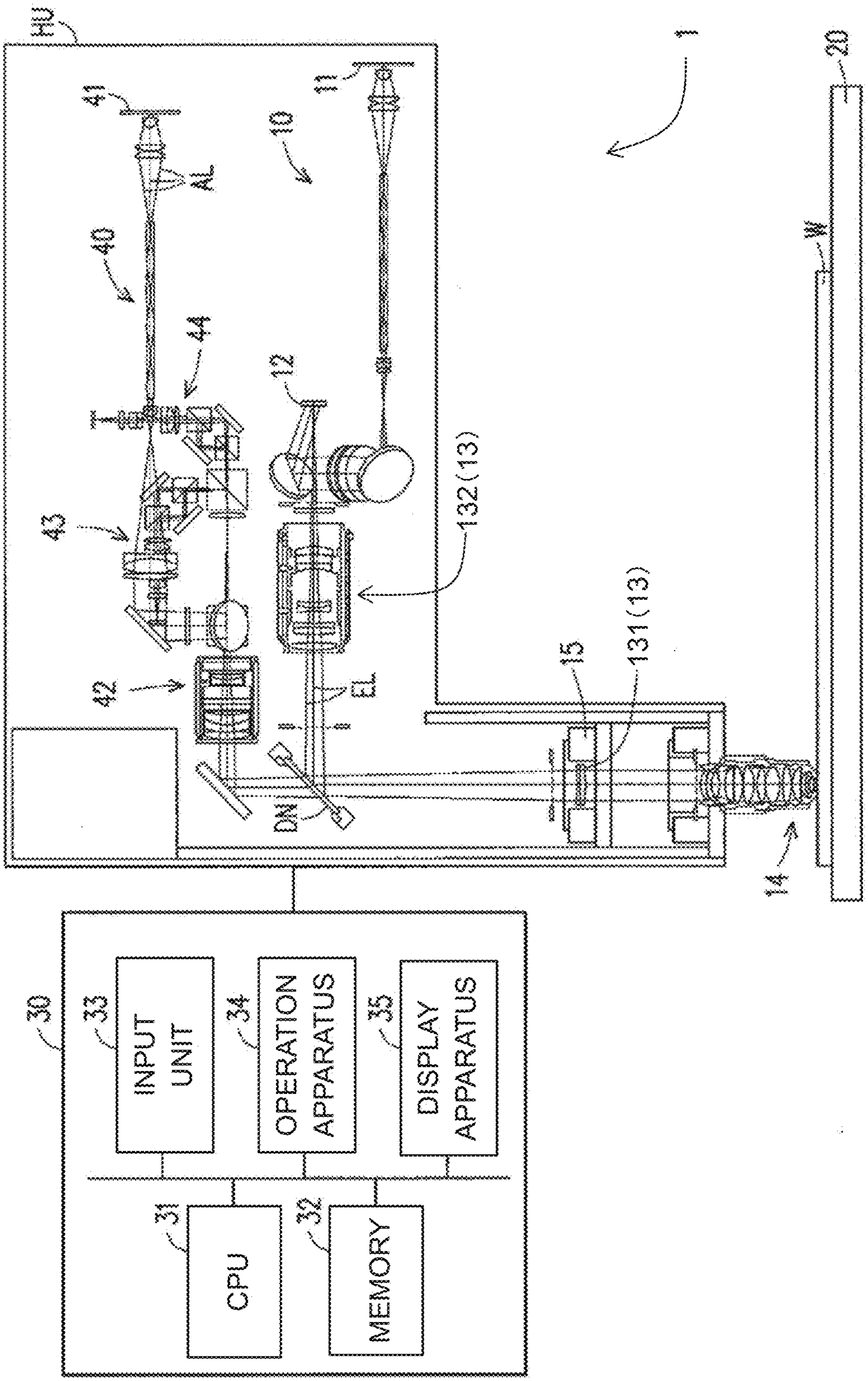
FIG. 1 is a structure explanatory view illustrating an example of an overall structure of an exposure apparatus of the present embodiment.

Hereinafter, an exposure apparatus will be described with reference to the drawings. However, the present disclosure is not limited to the embodiments described below.

In the following description, an XYZ orthogonal coordinate system defined by an X axis, a Y axis, and a Z axis orthogonal to one another is used to describe a positional relationship between a component constituting the exposure apparatus and a workpiece. In the following description, for convenience of description, the X axis direction and the Y axis direction are each referred to as a horizontal plane direction (i.e., a predetermined direction in the horizontal plane), and the Z axis direction is referred to as a perpendicular direction (i.e., a direction orthogonal to the horizontal plane, substantially the up-down direction). The +Z axis direction is upward (upper side), and the −Z axis direction is downward (lower side). The X axis is a main-scanning axis, and the Y axis is a sub-scanning axis. The main-scanning axis and the sub-scanning axis are only required to intersect each other, and need not be orthogonal to each other.

(1) Exposure Apparatus 1 of the Present Embodiment

An exposure apparatus 1 of the present embodiment will be described with reference to FIGS. 1 to 7. In an exposure process, the exposure apparatus 1 of the present embodiment uses light (exposure light) irradiated by an exposure optical system 10 mounted on an exposure head HU to expose a substrate coated with a resist agent (i.e., photosensitizing agent), that is, a workpiece W. The workpiece W exposed by the exposure apparatus 1 is, for example, a glass substrate used for manufacturing of a photomask. The workpiece W may be a glass substrate used for manufacturing a display panel of a display apparatus (e.g., a liquid-crystal display, an organic EL display, or the like) or a semiconductor wafer used for manufacturing an integrated circuit of a semiconductor device.

Furthermore, the resist agent of the present embodiment can be a positive photoresist or a negative photoresist depending on the type of the workpiece W to be exposed. A pattern (resist pattern) is formed on the workpiece W by the development process after the exposure process. Here, an exposed part of the positive photoresist causes a photochemical reaction to be dissolved in a developer, and an unexposed part is insoluble in the developer, and therefore the unexposed part remains on the substrate. In this manner, a pattern corresponding to the region to be scanned and exposed by the exposure head HU is formed on the substrate. On the other hand, the exposed part of the negative photoresist is insoluble in the developer due to crosslinking and curing, and the unexposed part is dissolved in the developer, and therefore the exposed part remains on the substrate. In this manner, a pattern opposite to the region scanned and exposed by the exposure head HU is formed on the substrate. For example, the type of the resist agent used for manufacturing a mask for exposure of a display panel of a display apparatus (a liquid-crystal display, an organic EL display, or the like) is a positive photoresist, and the resist agent used for manufacturing a mask for exposure of an integrated circuit of a semiconductor device can be a positive photoresist or a negative photoresist as actually necessary.

(1-1) Structure of Exposure Apparatus 1 of the Present Embodiment

Figure 2:
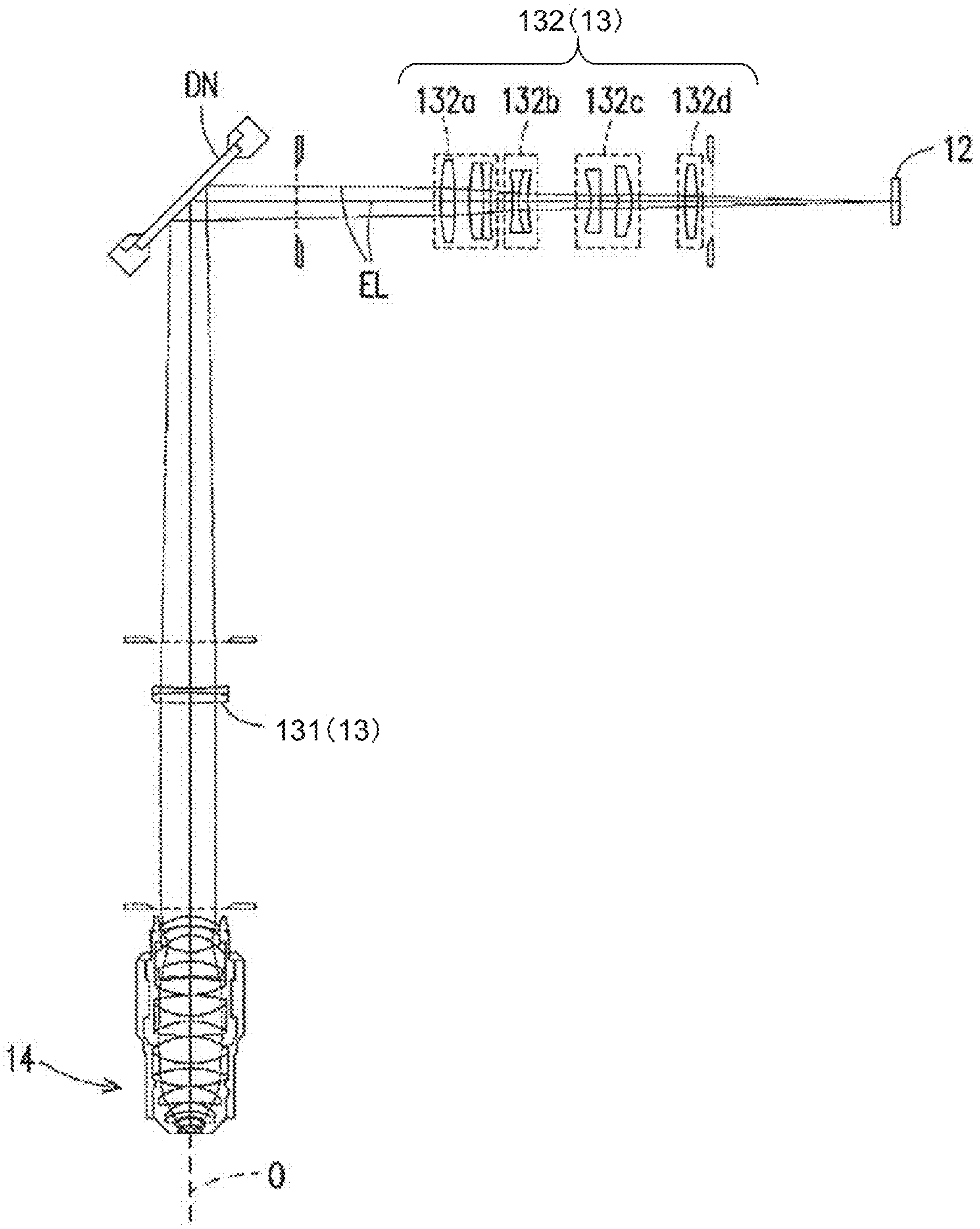
FIG. 2 is an explanatory view of an optical path after via an exposure pattern forming apparatus of the present embodiment.
Figure 3:
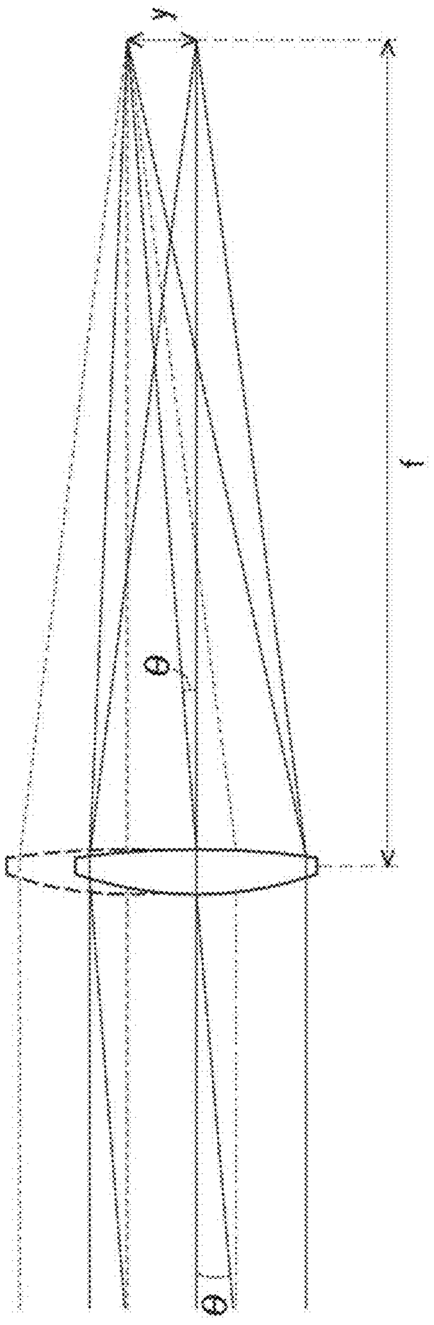
FIG. 3 is an explanatory view of an optical path change when a collimator lens of an example moves.

First, the structure of the exposure apparatus 1 of the present embodiment will be described with reference to FIGS. 1 and 2. FIG. 1 is a perspective view illustrating an example of the overall structure of the exposure apparatus 1 of the present embodiment. FIG. 2 is an explanatory view illustrating an optical path after via an exposure pattern forming apparatus 12 of the present embodiment. FIG. 3 is an explanatory view of an optical path change when a collimator lens of an example moves.

As illustrated in FIGS. 1 and 2, the exposure apparatus 1 includes at least one exposure head HU, a substrate stage 20, and a control unit 30. The exposure head HU is mounted with the exposure optical system 10 and an autofocus optical system 40. The exposure optical system 10 includes an exposure light source 11, the exposure pattern forming apparatus 12, a collimating optical system 13, and an objective optical system 14. Furthermore, the exposure light source 11 emits exposure light EL. The exposure light EL is light in an ultraviolet wavelength band such as 405 nm, for example. The wavelength band of the exposure light EL may be another wavelength band. The exposure pattern forming apparatus 12, the collimating optical system 13, and the objective optical system 14 are arranged on an optical path (in other words, on a transmission path) of the exposure light EL. The exposure pattern forming apparatus 12 is used to irradiate the workpiece W on the substrate stage 20 with the exposure light EL via the collimating optical system 13 and the objective optical system 14. It is to be noted that in the present embodiment, in a situation where each of the exposure heads HU includes the exposure light source 11, the exposure pattern forming apparatus 12 is positioned on the entire optical path of the exposure light EL. However, in another embodiment, the exposure light source 11 of each of the exposure heads HU may be provided outside the exposure head and made incident on each exposure pattern forming apparatus 12 of each of the exposure heads HU using an existing optical member. One exposure light source 11 may be provided outside each of the exposure heads HU, the exposure light EL emitted from one exposure light source 11 may be divided into a plurality of parts using an optical path design by an existing optical member, and the exposure pattern forming apparatus of each exposure head may be provided on the optical path of light of at least part of the exposure light EL.

The collimating optical system 13 collimates light of at least part of the exposure light EL from the exposure pattern forming apparatus 12. The objective optical system 14 concentrates, toward the workpiece W, light of at least part of the exposure light EL exiting the collimating optical system 13. Note that the exposure apparatus 1 further includes a driving apparatus 15 that displaces part of the optical members of the collimating optical system along an axis intersecting an optical axis O of the objective optical system 14. For example, the driving apparatus 15 is an existing apparatus such as a piezoelectric element.

More specifically, as illustrated in FIG. 2, the collimating optical system 13 includes a displacement optical system 131 and a variable magnification optical system 132 from the workpiece W side. When moved in a direction parallel to the surface of the workpiece W (direction perpendicular to the optical axis O), the displacement optical system 131 moves the irradiation position of light of at least part of the exposure light EL via at least one exposure element of the plurality of exposure elements on the workpiece W. In other words, here, the displacement optical system 131 is part of optical members of the collimating optical system, and is moved along an axis orthogonal to the optical axis O of the objective optical system 14 by the driving apparatus 15. Here, for example, the driving apparatus 15 is configured to be able to drive the displacement optical system 131 in a direction along the sub-scanning axis (Y axis). When the displacement optical system 131 is displaced in the direction along the sub-scanning axis (Y axis) by the driving apparatus 15, the irradiation position of light of at least part of the exposure light EL irradiated on the workpiece W also moves in the direction along the sub-scanning axis (Y axis). The movement amount of the irradiation position of light of at least part of the exposure light EL with which the workpiece W is irradiated can be changed based on the displacement amount of the displacement optical system 131 in the direction along the sub-scanning axis (Y axis) by the driving apparatus 15. Note that the direction in which the displacement optical system 131 is displaced need not be the direction along the sub-scanning axis (Y axis), may be a direction along the main-scanning axis (X axis), or may be a direction along an axis intersecting the sub-scanning axis (Y axis) and the main-scanning axis (X axis). Note that the displacement optical system 131 need not be displaced along an axis orthogonal to the optical axis O, and the driving apparatus 15 may drive the displacement optical system 131 so as to displace along an axis intersecting the optical axis O.

More specifically, when the displacement optical system 131 moves on the axis intersecting the optical axis O, the exposure light EL collimated by the displacement optical system 131 is displaced, the magnitude of the displacement amount can be regarded as an image height composed of parallel light obliquely incident on the displacement optical system 131 from the other side, and the image height and the focal length of the displacement optical system 131 have a relationship of a certain mathematical expression.

For example, as illustrated in FIG. 3, when the collimator lens is adjusted and moved on an axis perpendicular to the optical axis of incident light, the magnitude of the displacement amount of the collimated incident light is regarded as the image height generated by the parallel light incident in an inclination direction on the collimator lens from the other side, and the mathematical relationship between the image height and the focal point of the collimator lens is $y=f\cdot\tan\theta$.

That is, when the displacement optical system 131 moves on the axis orthogonal to the optical axis O, the displacement optical system 131 gives the displacement amount generated by the exposure light EL and the focal length of the displacement optical system 131 a mathematical relationship of $y=fc\cdot\tan\theta$, where fc is the focal length of the displacement optical system 131. Similarly, after the collimated exposure light EL is displaced, the collimated exposure light EL passes through the objective optical system 14, the irradiation position on the workpiece W also correspondingly generates a displacement amount y' by the displacement amount y, and y' and the focal length of the objective optical system 14 similarly have a mathematical system relationship of $y'=fo\cdot\tan\theta$, where fo is the focal length of the objective optical system 14.

It is possible to obtain $y'=(fo/fc)\cdot y$ based on the above two expressions. Thus, by controlling the magnitude of the displacement amount of the displacement optical system 131, it is possible to control the displacement amount of the irradiation position of light of at least part of the exposure light EL on the workpiece W.

Note that the lens configuration of the displacement optical system 131 of the collimating optical system 13 is two positive and negative cemented lenses in the present embodiment, specifically, a cemented lens of a biconvex lens and a biconcave lens. However, in another embodiment, the displacement optical system 131 may be a cemented lens of a concave meniscus lens and a planoconvex lens. Alternatively, it can be a combination of a biconvex lens and a cemented lens of a biconvex lens and a biconcave lens, or a combination of a cemented lens of a biconvex lens and a biconcave lens and a convex meniscus lens, and the present disclosure is not limited to them.

The variable magnification optical system 132 of the collimating optical system 13 includes a first lens group 132*a*, a second lens group 132*b*, a third lens group 132*c*, and a fourth lens group 132*d*. The first lens group 132*a* and the fourth lens group 132*d* are lens groups whose positions are fixed. The second lens group 132*b* and the third lens group 132*c* are lens groups movable in the optical axis O independently of each other. For example, the second lens group 132*b* and the third lens group 132*c* can be moved by an existing actuator such as a motor. More specifically, by moving the second lens group 132*b* and the third lens group 132*c* in the direction of the optical axis O, it is possible to change the variable magnification of the image (e.g., when the exposure pattern forming apparatus 12 is a DMD, an image of a reflection surface of an exposure element of the DMD) formed on the workpiece via the objective optical system 14.

As illustrated in FIG. 2, the refractive powers from the first lens group 132*a* to the fourth lens group 132*d* are positive, negative, positive, and positive, respectively, and in the present embodiment, the lens configuration of the first lens group 132*a* of the variable magnification optical system 132 is a combination of a biconvex lens and a cemented lens of a biconvex lens and a biconcave lens, the lens configuration of the second lens group 132*b* is a cemented lens of a biconcave lens and a concave meniscus lens, the lens configuration of the third lens group 132*c* is a combination of a planoconcave lens and a planoconvex lens, and the lens configuration of the fourth lens group 132*d* is a biconvex lens. The collimating optical system 13 is telecentric to the exposure pattern forming apparatus 12 side in order to efficiently take incident light (exposure light EL) from the exposure pattern forming apparatus 12. Note that the respective lens configurations of the first lens group 132*a* to the fourth lens group 132*d* described above are an example, and each lens configuration of the first lens group 132*a* to the fourth lens group 132*d* may have a configuration different from the above-described configuration including at least one lens having an existing shape or characteristic.

Note that the displacement optical system 131 is subjected to aberration correction so as to eliminate aberration variation due to XY displacement.

In the present embodiment, when the exposure apparatus 1 executes the exposure process, the workpiece W is irradiated with the exposure light EL from the exposure light source 11 via the exposure pattern forming apparatus 12, the collimating optical system 13, and the objective optical system 14. The exposure light EL is converted into a desired pattern (in other words, desired intensity distribution) by the exposure pattern forming apparatus 12, and a desired exposure pattern can be formed on the workpiece W (scheduled exposure region on the workpiece W). The exposure pattern is an exposure region of a desired pattern formed on the resist of the workpiece W by exposing the resist agent to light. More specifically, when a scanning path of the exposure light EL causes the exposure light EL to perform continuous exposure along the main-scanning axis, the exposure pattern generated in the scheduled exposure region has a linear shape.

As illustrated in FIG. 1, the autofocus optical system 40 includes an autofocus light source 41, the objective optical system 14 shared with the exposure optical system 10, an autofocus collimator lens group 42, a first autofocus detection optical system 43 having a predetermined depth of focus, and a second autofocus detection optical system 44 having a depth of focus shallower than the depth of focus of the first autofocus detection optical system 43. The autofocus light source 41 can provide an autofocus pattern image beam AL outside the photosensitizing wavelength band of a resist layer, and the workpiece W is irradiated with the autofocus pattern image beam AL via the autofocus collimator lens group 42 and the objective optical system 14 shared with the exposure optical system 10, and the autofocus optical system 40 forms an image of the autofocus pattern with the autofocus pattern image beam AL reflected by the workpiece W. For example, in the present embodiment, the autofocus pattern is a pattern between light and dark phases.

As illustrated in FIG. 1, a dichroic mirror DN is installed on the optical paths of the autofocus pattern image beam AL and the exposure light EL. Furthermore, the autofocus pattern image beam AL and the exposure light EL are each incident from both surfaces of the dichroic mirror DN, and the dichroic mirror DN can reflect one of the exposure light EL and the autofocus pattern image beam AL and transmit the other of the exposure light EL and the autofocus pattern image beam AL. In this manner, the autofocus pattern image beam AL and the exposure light EL are transmitted along the same direction after via the dichroic mirror DN, and the workpiece W is irradiated with the autofocus pattern image beam AL and the exposure light EL via the objective optical system 14.

The substrate stage 20 is disposed below the exposure head HU. The substrate stage 20 can hold the workpiece W. The substrate stage 20 can hold the substrate so that the upper surface of the workpiece W becomes parallel to the XY plane. The substrate stage 20 can release the workpiece W held. The workpiece W is a glass substrate of several meters (m) square, for example.

The substrate stage 20 can move along a plane (e.g., the XY plane) of the substrate stage 20 in a state of holding the workpiece W. The substrate stage 20 can move along the X axis direction. For example, the substrate stage 20 can move along the X axis direction by the operation of a substrate stage driving system including an arbitrary motor. The substrate stage 20 is movable along the Y axis direction in addition to being movable in the X axis direction. For example, the substrate stage 20 can move along the Y axis direction by the operation of the substrate stage driving system including the arbitrary motor. Note that the substrate stage 20 may be configured to be movable along the Z axis direction.

The control unit 30 can control the operation of the exposure apparatus 1. The control unit 30 includes, for example, a central processing unit (CPU), a read only memory (ROM), and random access memory (RAM).

The control unit 30 controls the substrate stage driving system to perform exposure in a step and repeat or a continuous scan manner. That is, the control unit 30 can control the substrate stage driving system so that the exposure head HU holding the exposure pattern forming apparatus 12 and the substrate stage 20 holding the workpiece W continue to relatively move along a predetermined main-scanning axis or sub-scanning axis. As a result, the plurality of scheduled exposure regions of the workpiece W are irradiated with the exposure light EL correspondingly. In the following description, the main-scanning axis along which the exposure head HU and the substrate stage 20 relatively move is referred to as the X axis direction, and the Y axis direction orthogonal to the X axis direction is referred to as a "sub-scanning axis" as appropriate.

In the present embodiment, in the relative movement along the main-scanning axis or the sub-scanning axis, relatively moving the workpiece and the exposure pattern forming apparatus (DMD) along the main-scanning axis or the sub-scanning axis and relatively moving the workpiece and the exposure head along the main-scanning axis or the sub-scanning axis are synonymous.

Figure 4:
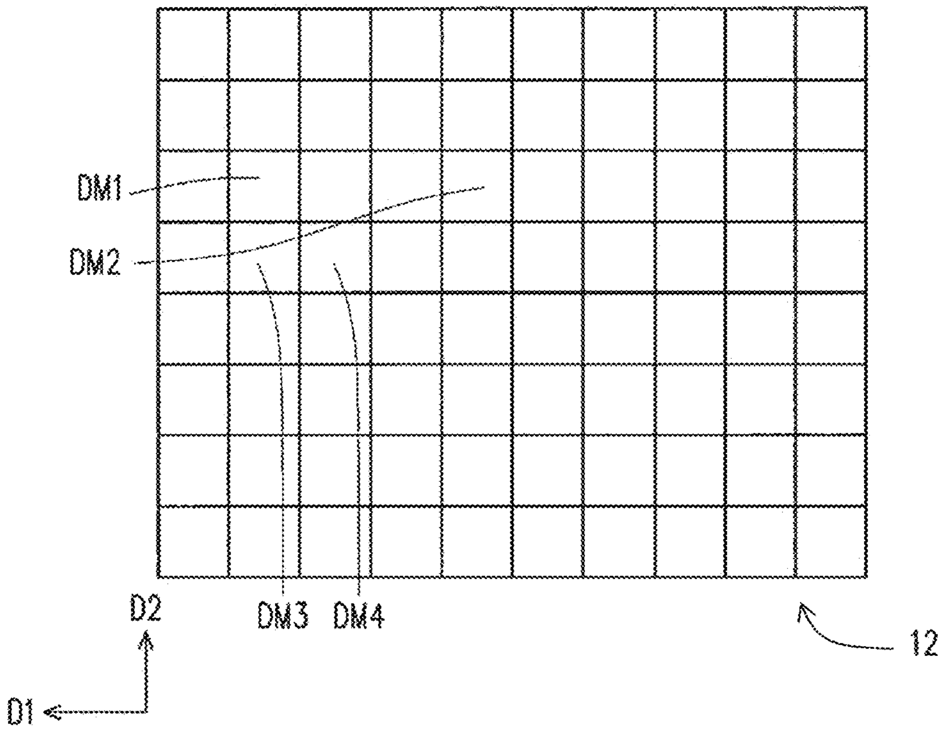
FIG. 4 is a front view of the exposure pattern forming apparatus.
Figure 5:
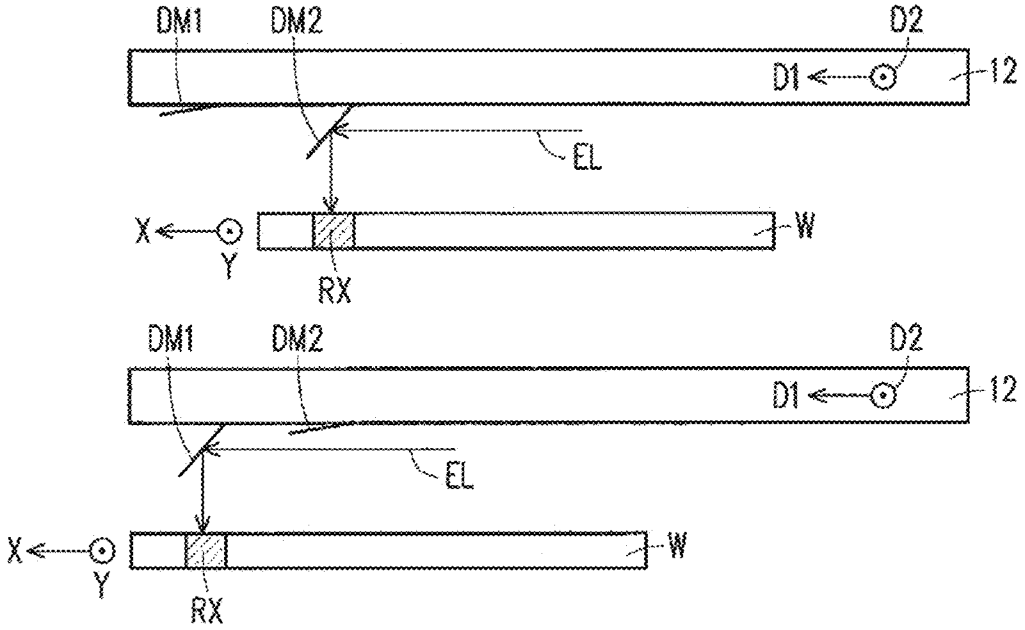
FIG. 5 is an explanatory view illustrating that a workpiece and an exposure head of the present embodiment continue to relatively move along a main-scanning axis.
Figure 6:
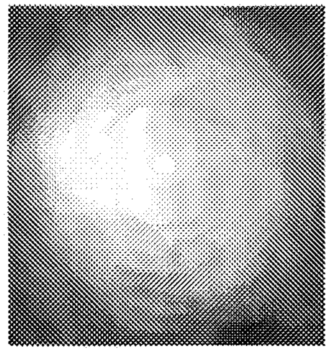
FIG. 6 is an explanatory view illustrating a light amount distribution of exposure light via the exposure pattern forming apparatus of the present embodiment.
Figure 7:
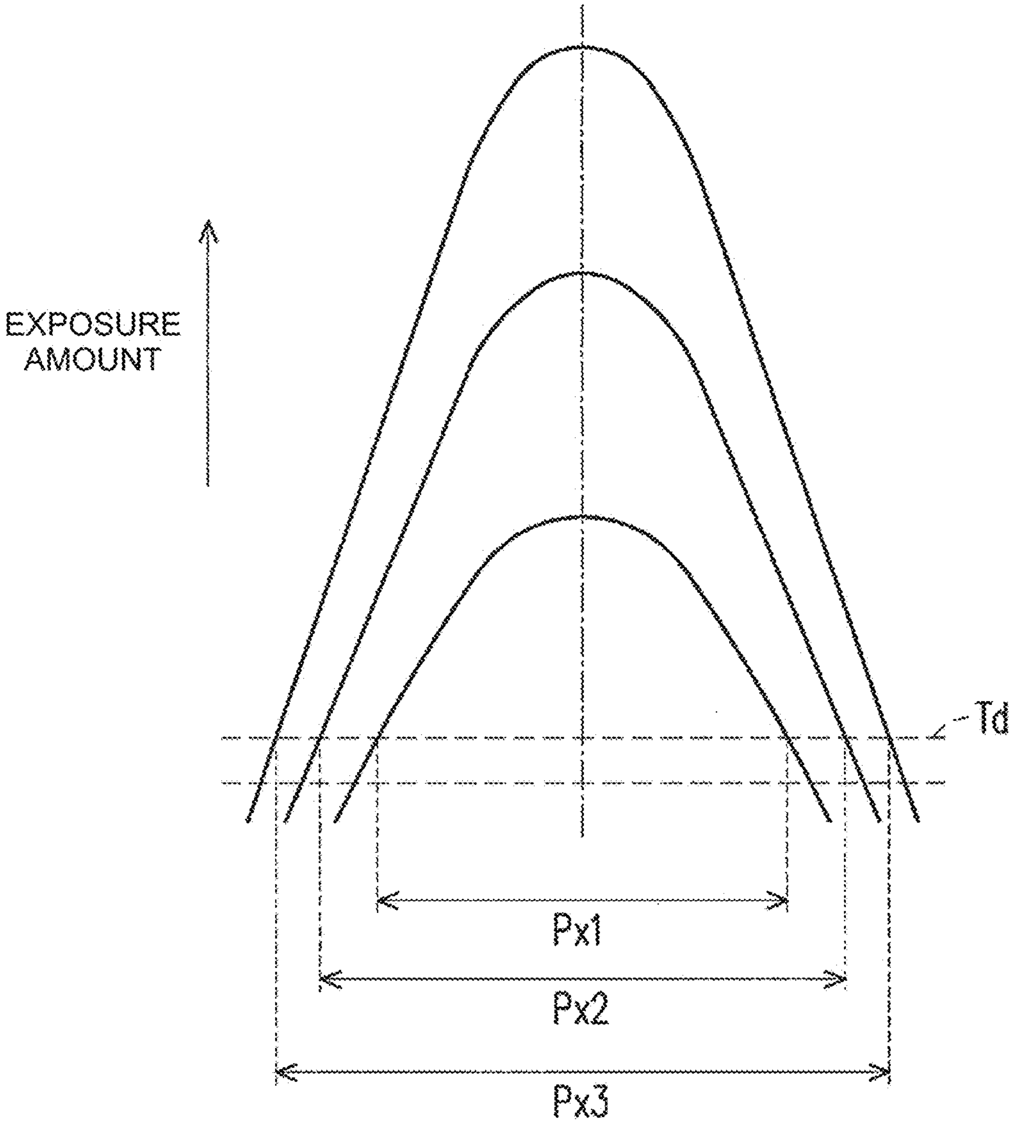
FIG. 7 is a relationship explanatory view of an integrated exposure amount in a scheduled exposure region of exposure light of the present embodiment and a range of a pattern formed through an exposure process and a development process.

(1-2) Arrangement of Scheduled Exposure Region and Generation of Pattern EP Formed in Predetermined Region RX Next, the arrangement of the scheduled exposure region set on the workpiece W and the generation of a pattern EP formed in a predetermined region RX will be described with reference to FIGS. 4 to 6. FIG. 4 is a front view of the exposure pattern forming apparatus, and FIG. 5 is an explanatory view illustrating that the workpiece W and the exposure head HU of the present embodiment continue to relatively move along the main-scanning axis. FIG. 6 is an explanatory view illustrating the light amount distribution of exposure light via the exposure pattern forming apparatus of the present embodiment. FIG. 7 is a relationship explanatory view of an integrated exposure amount in a scheduled exposure region of exposure light EL of the present embodiment and the range of the pattern EP formed through the exposure process and the development process.

As illustrated in FIG. 4, the exposure pattern forming apparatus 12 of the present embodiment is, for example, a digital micromirror device (DMD), the exposure pattern forming apparatus 12 includes a plurality of exposure elements, each exposure element is a respective micromirror of the DMD, and the plurality of exposure elements are two-dimensionally arrayed. The micromirror is an element having a reflection surface that reflects light. For example, in the present embodiment, the DMD includes 1920×1080 micromirrors, that is, the DMD has 1920×1080 pixels. Specifically, the plurality of exposure elements in the same row are arranged side by side along a first direction D1, the plurality of exposure elements are arranged side by side in a second direction, and the first direction is orthogonal to a second direction D2. Corresponding regions scanned on the workpiece W by the plurality of exposure elements in the same row are the same scheduled exposure regions. That is, in the present embodiment, the plurality of different exposure elements can be used to irradiate the plurality of scheduled exposure regions of the workpiece W with the exposure light EL correspondingly. Here, the row means the same arrangement along the first direction D1. The arrangement along the first direction D1 can also be paraphrased as a row. For example, when the exposure head HU of the exposure pattern forming apparatus and the substrate stage 20 holding the workpiece W relatively move along the main-scanning axis, the plurality of scheduled exposure regions extend along the main-scanning axis and are arranged side by side along the sub-scanning axis orthogonal to the main-scanning axis. Each exposure element provided in the exposure pattern forming apparatus 12 is configured to be capable of independently changing the angle of the light reflection surface. When the reflection surface of the exposure element is set to a first angle, the light reflected by the reflection surface is incident on the workpiece W via the collimating optical system 13 and the objective optical system 14. On the other hand, when the reflection surface of the exposure element is set to a second angle, the light reflected by the reflection surface is incident on and absorbed by a light absorbing member not illustrated, and thus is not incident on the workpiece W. For example, at least part of the exposure elements of the plurality of exposure elements provided in the exposure pattern forming apparatus 12 are set to the first angle, and part of the other exposure elements are set to the second angle, and thus light of at least part of the exposure light EL from the exposure light source 11 reflected by the reflection surface of at least part of the exposure elements set to the first angle is incident on the workpiece W. That is, the exposure pattern forming apparatus 12 can form an exposure region of a desired pattern by selectively causing light of at least part of the exposure light EL from the exposure light source 11 to be incident on the workpiece W. Here, the first angle is referred to as the first state (in other words, the on state), and the second angle is referred to as the second state (in other words, the off state).

As illustrated in FIG. 5, the control unit 30 controls whether the workpiece W is irradiated with the exposure light EL via each exposure element by switching between the first state and the second state of the plurality of exposure elements in accordance with the relative movement along the main-scanning axis of the exposure head HU holding the exposure pattern forming apparatus 12 and the substrate stage 20 holding the workpiece W. FIG. 5 illustrates a change (change between the first state and the second state) in the inclination of the reflection surface of each of a first exposure element DM1 and a second exposure element DM2 in accordance with the relative movement of the exposure pattern forming apparatus 12 (exposure head HU) and the workpiece W (substrate stage 20). As an example, as illustrated in FIG. 5, the first exposure element DM1 and the second exposure element DM2 are different exposure elements in the same row among the plurality of exposure elements, and the control unit 30 integrates the exposure amount in the predetermined region RX by sequentially irradiating the predetermined region RX of the scheduled exposure region, in accordance with the relative movement of the workpiece W and the exposure pattern forming apparatus 12, with light of part of the exposure light EL via the first exposure element DM1 in the first state among the plurality of exposure elements and light of part of the exposure light EL via the second exposure element DM2 in the first state different from the first exposure element DM1 among the plurality of exposure elements.

Furthermore, as illustrated in FIG. 5, as the exposure head HU holding the exposure pattern forming apparatus 12 and the substrate stage 20 holding the workpiece W continue to relatively move, the control unit controls the first state or the second state of the plurality of exposure elements of each exposure unit, and controls the predetermined region RX of the scheduled exposure region to be irradiated by different exposure elements in the first state different in order. In this way, by controlling the integrated number of times of irradiation of the predetermined region RX of the scheduled exposure region, it is possible to control the integrated exposure time of the exposure light at each portion of the scheduled exposure region. That is, the integrated exposure time of the predetermined region RX of the scheduled exposure region is the sum of times (exposure times) of irradiation with light of at least part of the plurality of exposure lights EL of the predetermined region RX.

In this way, as illustrated in FIG. 4, when irradiating the exposure light EL in accordance with the relative movement of the workpiece W and the exposure pattern forming apparatus 12, by switching the state of each exposure element of the exposure pattern forming apparatus 12 between the first state and the second state, the control unit 30 can control the integrated exposure time of the exposure light EL to each predetermined region RX of the scheduled exposure region. In this way, the exposure apparatus 1 can integrate the exposure amount of at least part of the plurality of exposure lights EL to the predetermined region RX of the corresponding scheduled exposure region. Furthermore, the exposure amount to each predetermined region RX of the scheduled exposure region of the workpiece W can be controlled based on the above method.

The control unit 30 controls the integrated exposure time in the predetermined region RX and further controls the integrated exposure amount in the predetermined region RX based on the number of exposure elements in the first state that sequentially irradiates the predetermined region RX of the scheduled exposure region with light of part of the exposure light EL in accordance with the relative movement of the workpiece W and the exposure pattern forming apparatus 12.

Specifically, the exposure amount in the predetermined region RX of the scheduled exposure region is determined by the exposure intensity and the exposure time of the exposure light EL with which the predetermined region RX is irradiated. In the present embodiment, as an example, assuming that the exposure intensity of the exposure light EL and the time (on time) during which the exposure element is in the first state are constant, when the number of exposure elements in the first state for irradiating the predetermined region RX of the scheduled exposure region with light of part of the exposure light EL changes, the integrated exposure amount with which the predetermined region RX is irradiated also changes. However, the present disclosure is not limited to this. In another example, the control unit 30 may control the exposure amount with which the predetermined region RX is irradiated by changing at least one of the exposure intensity of the exposure light EL via each exposure element and the time (on time) during which each exposure element is in the first state. The control unit 30 may control the exposure amount with which the predetermined region RX is irradiated by changing the number of exposure elements in the first state with which the predetermined region RX of the scheduled exposure region is irradiated with light of part of the exposure light EL and changing at least one of the exposure intensity of the exposure light EL via each exposure element and the time (ON time) during which each exposure element is in the first state.

As described above, the control unit 30 of the present embodiment can integrate the exposure amount in the predetermined region RX by sequentially irradiating the predetermined region RX of the scheduled exposure region with light of part of the exposure light EL via the first exposure element DM1 in the first state among the plurality of exposure elements and light of part of the exposure light EL via the second exposure element DM2 in the first state among the plurality of exposure elements in accordance with the relative movement of the workpiece W and the exposure pattern forming apparatus 12.

In the present embodiment, as illustrated in FIG. 7, when the exposure amount (integrated exposure amount) of the predetermined region RX of the scheduled exposure region of the workpiece W is equal to or more than a predetermined threshold Td (the predetermined threshold Td is, for example, a standard value of an exposure amount for accurately exposing the resist agent), the resist agent thereon is exposed. For example, the maximum number of times of irradiation (e.g., the maximum number of exposure elements capable of sequentially irradiating the predetermined region RX with light of part of the exposure light EL in accordance with the relative movement of the workpiece W and the exposure pattern forming apparatus 12) to the predetermined region RX on the workpiece W in the same row is set in advance, and the necessary exposure amount of at least light of part of each exposure light EL each time can be precisely adjusted based on the exposure intensity, the maximum number of times of irradiation, the exposure time each time, and the magnitude of the predetermined threshold Td. For example, the pattern EP (resist pattern) can be formed in the predetermined region RX of the scheduled exposure region of the workpiece W by integrating the exposure amount by increasing the number of times of irradiation in the predetermined region RX of the scheduled exposure region. For example, in the present embodiment, the maximum number of times of irradiation is, for example, 256 times (in other words, up to 256 exposure elements are used for exposure to the predetermined region RX), but the present disclosure is not limited to this.

In a known technique, when the light amount with which the exposure region is irradiated is uniform in the exposure region, a pattern having the same size (shape) as the exposure region is formed on the workpiece W after the development process. On the other hand, in the present embodiment, as illustrated in FIG. 6, the light amount of the center part in the region where the scheduled exposure region is irradiated with light of part of the exposure light EL via one exposure element in the first state is larger than the light amount of the peripheral part in the irradiated region. Specifically, in the present embodiment, due to diffraction of the light (light of part of the exposure light EL) reflected by the micromirror of the digital micromirror device, the light amount in the center part of the region where the scheduled exposure region is irradiated with the light becomes larger than the light amount in the peripheral part. Therefore, as illustrated in FIG. 7, as the region applied with the exposure amount equal to or larger than the threshold Td in the exposure region (exposed resist layer) on the workpiece W is enlarged along with an increase in the integrated exposure amount, and thus the size of the pattern EP formed in the exposure region of the workpiece W through the development process is also enlarged to Px1, Px2, and Px3. That is, the relationship between the sizes Px1, Px2, and Px3 of the pattern EP formed in the exposure region through the exposure process and the development process of the workpiece W and the integrated exposure amount of the exposure light EL to the scheduled exposure region has a positive correlation characteristic. In the present example, the increase in the integrated exposure amount is controlled by controlling the number of times of irradiation, but the present disclosure is not limited to this. In another example, the integrated exposure amount is controlled by controlling the light amount of the exposure light EL or the exposure time (irradiation time of the exposure light EL) every time, thereby achieving the control of the size of the pattern EP.

In this manner, by controlling the integrated exposure amount, it is possible to form the precise pattern EP in the predetermined region RX of the workpiece W.

(1-3) Exposure Pattern Formation and Width Control Process

Figure 8:
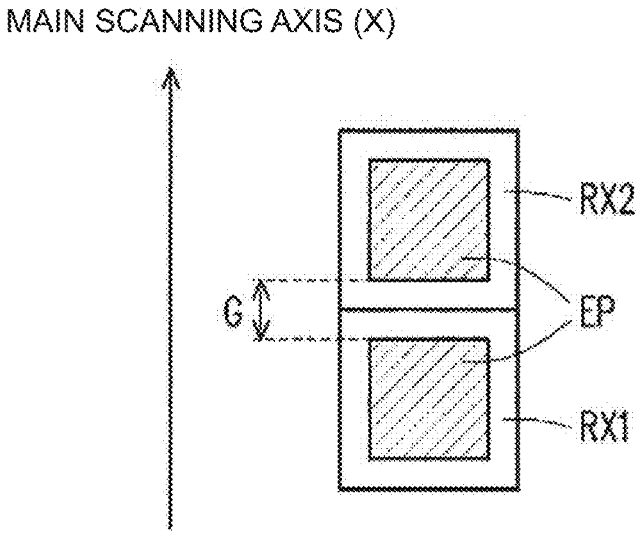
FIG. 8 is an outline explanatory view illustrating an example of a pattern formed in a predetermined region in a scheduled exposure region of the workpiece of the present embodiment.
Figure 9:
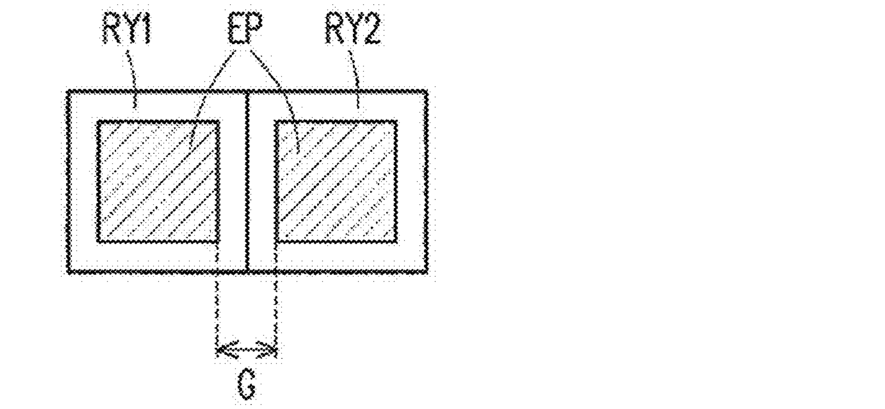
FIG. 9 is an outline explanatory view illustrating another example of a pattern formed in a predetermined region in a scheduled exposure region of the workpiece of the present embodiment.

Next, the formation of the pattern EP formed in the predetermined region RX in the scheduled exposure region of the workpiece W through the exposure process and the development process and the control of the width will be described with reference to FIGS. 8 and 9. FIG. 8 is an outline explanatory view illustrating an example of the pattern EP formed in the predetermined region RX in the scheduled exposure region of the workpiece W of the present embodiment. FIG. 9 is an outline explanatory view illustrating another example of the pattern EP formed in the predetermined region RX in the scheduled exposure region of the workpiece W of the present embodiment.

Furthermore, in the present embodiment, the scheduled exposure region can include a plurality of the predetermined regions RX, and one predetermined region RX corresponds to, for example, a region where the workpiece W is irradiated with light of part of the exposure light EL via one exposure element in the first state. As described above, the control unit 30 sequentially sets the plurality of exposure elements (e.g., first exposure element DM1 and second exposure element DM2) in the same row to the first state (ON) in accordance with the relative movement of the workpiece W and the exposure pattern forming apparatus 12 (exposure head HU), and integrates the exposure amount in the predetermined region RX in the corresponding scheduled exposure region, whereby the pattern EP is formed after the development process.

More specifically, since the relationship between the size of the pattern formed in the exposure region through the exposure process and the development process of the workpiece W and the integrated exposure amount to the scheduled exposure region by the exposure light EL has a positive correlation characteristic, the relationship between the width of the pattern EP in the direction along the sub-scanning axis in the predetermined region RX formed by light of at least a part of the plurality of exposure light EL and the integrated exposure amount to the predetermined region RX by the exposure light EL also has a positive correlation characteristic. As a result, by controlling the integrated exposure amount (i.e., the sum of the exposure amounts of light of at least part of the exposure light EL with which the same predetermined region RX is irradiated) of the same predetermined region RX, the control unit 30 can control the width of the pattern EP in the predetermined region RX in the main-scanning axis and the width of the pattern EP in the sub-scanning axis orthogonal to the main-scanning axis.

For example, when the exposure amount of a predetermined portion of the scheduled exposure region of the workpiece W is larger than the predetermined threshold Td, the exposure of the resist agent thereon is completed. Therefore, when the integrated exposure amount of adjacent predetermined regions RX is equal to or larger than the predetermined threshold Td, the resist agent of these predetermined regions RX is completely exposed, and the outlines of the patterns EP formed in the adjacent predetermined regions RX are in contact with each other. In this manner, the patterns EP of different predetermined regions RX are in contact with each other, and thus a pattern EP having a relatively wide width can be formed. When any of the integrated exposure amount of the adjacent predetermined regions RX is smaller than the predetermined threshold Td, in the resist agent of each of the predetermined regions RX, only the center part of the predetermined region RX is completely exposed, the peripheral part is not completely exposed, and a gap exists between the patterns EP formed in the adjacent predetermined regions RX. In this manner, a pattern EP having a relatively small width can be formed in different predetermined regions RX.

As described above, by controlling the integrated exposure amount in the predetermined region RX, the control unit 30 of the exposure apparatus 1 controls the width of the pattern EP formed in the predetermined region RX through the exposure process with the exposure light EL to the predetermined region RX. By controlling the integrated exposure amount of each predetermined region RX, the exposure apparatus 1 can form connection or separation of the patterns EP of different predetermined regions RX, whereby a precise pattern EP can be formed on the workpiece W.

For example, as illustrated in FIG. 8, the control unit 30 relatively moves the workpiece W and the exposure pattern forming apparatus 12 along the main-scanning axis, and sequentially irradiates a region RX2 adjacent to the predetermined region RX (here, referred to as RX1) in the scheduled exposure region along the main-scanning axis with light of at least part of the exposure light EL via each of the plurality of exposure elements in the first state different from one another in accordance with the relative movement of the workpiece W and the exposure pattern forming apparatus 12, thereby integrating the exposure amount in the region RX2 adjacent to the predetermined region RX1 along the main-scanning axis. The predetermined region RX1 and the predetermined region RX2 may be exposed (integrate desired exposure amount) by one relative movement of the workpiece W and the exposure pattern forming apparatus 12 along the main-scanning axis, or the predetermined region RX1 and the predetermined region RX2 may be exposed (integrate desired exposure amount) by separate relative movements of the workpiece W and the exposure pattern forming apparatus 12 along the main-scanning axis.

The control unit 30 integrates the exposure amount in the region RX2 adjacent to the predetermined region RX1 along the main-scanning axis by sequentially irradiating the region RX2 adjacent to the predetermined region RX1 along the main-scanning axis with light of at least part of the exposure light EL via each of the plurality of exposure elements while relatively moving the workpiece W and the exposure pattern forming apparatus 12. Here, the plurality of exposure elements for irradiating the predetermined region RX1 of the scheduled exposure region are the plurality of exposure elements of the same row. In this case, the plurality of exposure elements of the exposure pattern forming apparatus 12 used for exposure of the predetermined region RX2 may be the same exposure elements as the plurality of exposure elements (the first exposure element DM1 and the second exposure element DM2) used for the predetermined region RX1, or may be other plurality of exposure elements on the same row as the first exposure element DM1 and the second exposure element DM2.

By controlling the integrated exposure amount of the predetermined region RX1 and the region RX2 adjacent to the predetermined region RX1 along the main-scanning axis, the control unit 30 controls an interval G in the main-scanning axis between the pattern EP formed in the predetermined region RX1 through the exposure process with the exposure light EL to the region RX2 adjacent to the predetermined region RX1 along the main-scanning axis and the pattern EP formed in the region RX2 adjacent to the predetermined region RX1 along the main-scanning axis. More specifically, the size of the pattern EP formed in each of the predetermined region RX1 and the predetermined region RX2 can be changed by the integrated exposure amount applied to the predetermined region RX1 and the predetermined region RX2, respectively (see FIG. 7). Therefore, by controlling the integrated exposure amount given to each of the predetermined region RX1 and the predetermined region RX2, the control unit 30 can control the interval G in the main-scanning axis of the pattern EP formed in each of the predetermined region RX1 and the predetermined region RX2.

In this manner, it is possible to control connection or separation between the patterns EP in the different regions RX1 and RX2 along the main-scanning axis by controlling the integrated exposure amount of each of the regions RX1 and RX2 along the main-scanning axis, and this enables formation of a precise pattern on the workpiece W.

On the other hand, as illustrated in FIGS. 4 and 9, the control unit 30 integrates the exposure amount in a region RY2 adjacent to the predetermined region RX (here, referred to as RY1) by relatively moving the workpiece W and the exposure pattern forming apparatus 12 along the main-scanning axis, and sequentially irradiates along the sub-scanning axis orthogonal to the main-scanning axis in the scheduled exposure region with light of part of the exposure light EL via the third exposure element DM3 in the first state among the plurality of exposure elements and light of part of the exposure light EL via the fourth exposure element DM4 in the first state among the plurality of exposure elements in accordance with the relative movement along the main-scanning axis of the workpiece W and the exposure pattern forming apparatus 12. The predetermined region RY1 and the predetermined region RY2 may be exposed (integrate desired exposure amount) by one relative movement of the workpiece W and the exposure pattern forming apparatus 12 along the main-scanning axis, or the predetermined region RY1 and the predetermined region RY2 may be exposed (integrate desired exposure amount) by separate relative movements of the workpiece W and the exposure pattern forming apparatus 12 along the main-scanning axis.

Specifically, the third exposure element DM3 and the fourth exposure element DM4 are a plurality of exposure elements in the same row, and the row in which the third exposure element DM3 and the fourth exposure element DM4 are positioned is different from the row in which the first exposure element DM1 and the second exposure element DM2 are positioned. The positions of the first exposure element and the second exposure element on the DMD and the positions of the third exposure element DM3 and the fourth exposure element DM4 on the DMD do not need to be adjacent to each other, and it is sufficient that the row in which the first exposure element DM1 and the second exposure element DM2 are positioned and the row in which the third exposure element DM3 and the fourth exposure element DM4 are positioned are adjacent to each other. That is, the plurality of exposure elements for irradiating the region RY2 adjacent to the predetermined region RY1 in the scheduled exposure region along the sub-scanning axis orthogonal to the main-scanning axis are the plurality of exposure elements (e.g., third exposure element DM3 and fourth exposure element DM4) positioned in the same row, and this row is different from and adjacent to the row in which the plurality of exposure elements (e.g., first exposure element DM1 and second exposure element DM2) for irradiating the predetermined region RY1 in the scheduled exposure region is positioned.

In this manner, the control unit 30 controls the integrated exposure amount of the predetermined region RY1 and the region RY2 adjacent to the predetermined region RY1 along the sub-scanning axis, and thus controls the interval G in the sub-scanning axis between the pattern EP formed in the predetermined region RY1 through the exposure process with the exposure light EL to the predetermined region RY1 and the region RY2 adjacent to the predetermined region RY1 along the sub-scanning axis and the pattern EP formed in the region RY2 adjacent to the predetermined region RY1 along the sub-scanning axis. More specifically, the size of the pattern EP formed in each of the predetermined region RY1 and the predetermined region RY 2 can be changed by the integrated exposure amount applied to the predetermined region RY1 and the predetermined region RY2, respectively (see FIG. 7). Therefore, the control unit 30 can control the interval G in the sub-scanning axis of the pattern EP formed in each of the predetermined region RY1 and the predetermined region RY2 by controlling the integrated exposure amount applied to the predetermined region RY1 and the predetermined region RY2, respectively.

As described above, by controlling the integrated exposure amount with respect to each of the regions RY1 and RY2 along the sub-scanning axis, the exposure apparatus can control connection or separation of the patterns EP in the different regions RY1 and RY2 along the main-scanning axis, and this enables a pattern of a precise layout to be formed on the workpiece W.

(1-4) Formation Process of Oblique Pattern EPS

Figure 10:
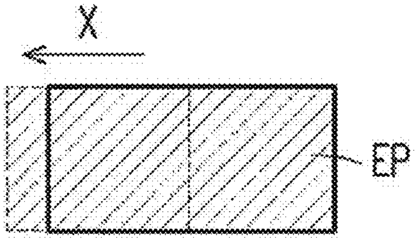
FIG. 10 is an explanatory view illustrating a pattern of continuous exposure.
Figure 11:
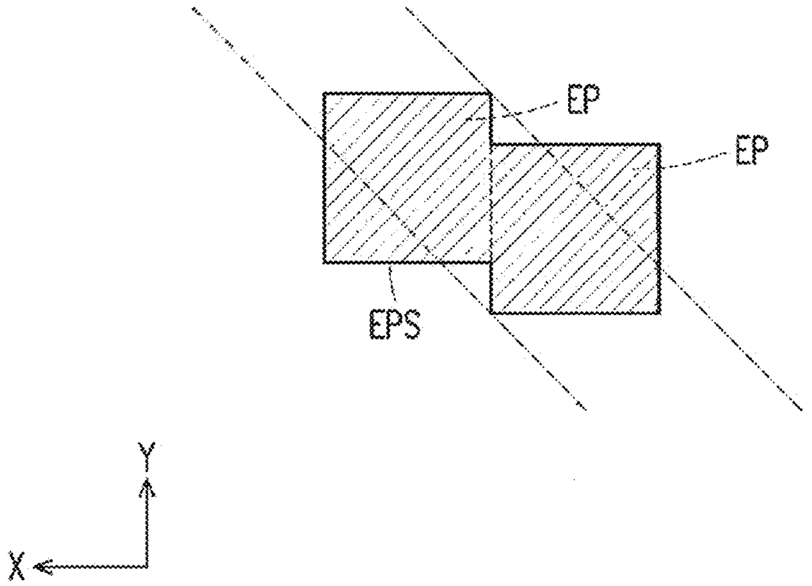
FIG. 11 is an explanatory view illustrating a formation process of a pattern to a scheduled exposure region in an oblique direction in a known technique.
Figure 12:
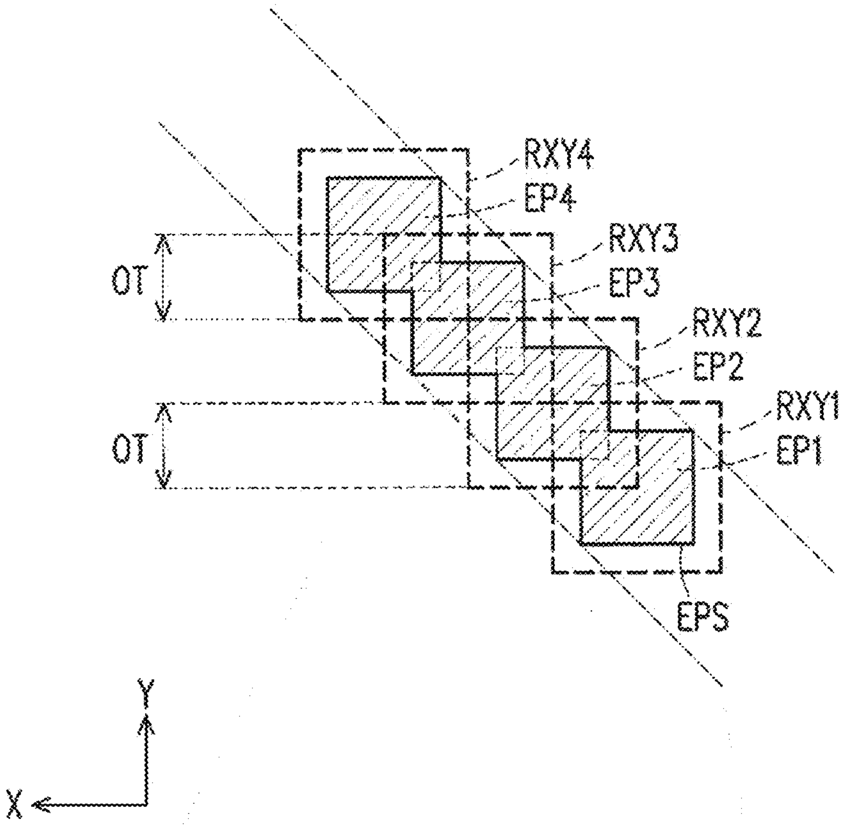
FIG. 12 is a process explanatory view illustrating an example of exposure pattern formation in a scheduled exposure region in an oblique direction of the present embodiment.

Next, the formation process of an oblique pattern EPS will be described with reference to FIGS. 10 to 12. FIG. 10 is an explanatory view illustrating a pattern of continuous exposure. FIG. 11 is an explanatory view illustrating the formation process of the pattern EP in the scheduled exposure region in an oblique direction in a known technique. FIG. 12 is a process explanatory view illustrating an example of exposure pattern formation in the scheduled exposure region in the oblique direction of the present embodiment.

As illustrated in FIG. 10, when the scanning path of the exposure light EL causes the exposure light EL to perform continuous exposure along the main-scanning axis, the pattern EP generated in the scheduled exposure region has a linear shape. Here, the meaning of continuous exposure is that the control unit 30 integrates the exposure amount in the predetermined region RX by sequentially irradiating the predetermined region RX of the scheduled exposure region with light of part of the exposure light EL via the first exposure element DM1 in the first state and light of part of the exposure light EL via the second exposure element DM2 in the first state while relatively moving the workpiece and the exposure pattern forming apparatus, that is, the exposure head including the exposure pattern forming apparatus and the workpiece continue to relatively move, and integrates the exposure amounts in the plurality of predetermined regions RX. As illustrated in FIG. 10, in the present example, the patterns EP in the plurality of predetermined regions RX can be continuously connected to each other on the main-scanning axis, and the linear pattern EP can be formed. Here, the pattern EP refers to a partial pattern formed in a plurality of predetermined regions through the exposure process and the development process of the workpiece W, and the oblique pattern EPS is an entire pattern including a plurality of patterns EP. That is, the oblique pattern EPS is the entire outline of the pattern formed through the exposure process and the development process on the workpiece.

In general, as illustrated in FIG. 11, when the oblique pattern EPS is formed by a known exposure method, different patterns EP corresponding to different exposure elements in different rows are formed, and the oblique pattern EPS is formed in combination by controlling the relative positions of these different patterns EP. However, as illustrated in FIG. 11, the widths in the sub-scanning axis direction of the patterns EP of the different predetermined regions RX of the scheduled exposure region in the known exposure method are limited (fixed) corresponding to the widths (pitches) of the exposure elements. Therefore, it has been difficult to form the oblique pattern EPS having a smooth outline.

In the present embodiment, the control unit 30 can control the driving apparatus 15 so as to displace the region irradiated with light of at least part of the exposure light EL via at least one exposure element of the plurality of exposure elements by the displacement optical system 131 of the collimating optical system 13 so that a partial region of a scheduled exposure region along the sub-scanning axis with respect to the predetermined region RX is irradiated with light of at least part of the exposure light EL via at least one exposure element of the plurality of exposure elements.

More specifically, the driving apparatus 15 is controlled to displace the displacement optical system 131 along an axis orthogonal to the optical axis so that a part of region of the scheduled exposure region along the sub-scanning axis intersecting the main-scanning axis with respect to the predetermined region RX is irradiated with light of at least part of the exposure light via at least one exposure element of the plurality of exposure elements. For example, in the present embodiment, the direction in which the displacement optical system 131 is displaced is the direction of the sub-scanning axis.

In the present example, for example, the driving apparatus 15 displaces the part of the displacement optical system 131 along an axis intersecting the optical axis so that an irradiation position of light of at least part of the exposure light is displaced at an irradiation interval smaller than an irradiation interval of light of at least part of the exposure light in the scheduled exposure region corresponding to an interval between exposure elements adjacent to each other two-dimensionally arrayed in the exposure pattern forming apparatus 12.

(1-4-1) Formation Method of Oblique Pattern

In the present embodiment, as illustrated in FIG. 12, the control unit 30 integrates the exposure amount by irradiation of light via the plurality of exposure light elements in the first state different from one another in each of the regions by sequentially irradiating a partial region of the scheduled exposure region with light of part of the exposure light EL via the plurality of exposure elements in the first state different from one another in accordance with the relative movement of the workpiece W and the exposure head HU in the direction along the main-scanning axis. Here, the control unit 30 can form the oblique pattern EPS by controlling the sizes of the patterns EP1, EP2, EP3, and EP4 formed through the development process by controlling, with the above-described method, the integrated exposure amount of each region (RXY1, RXY2, RXY3, and RXY4) of the scheduled exposure region with light of at least part of the exposure light EL via the plurality of exposure elements in rows different one another. Here, the oblique pattern EPS indicates the entire pattern configured by connecting patterns EP1, EP2, EP3, and EP4 in a plurality of regions. Each of the regions (RXY1, RXY2, RXY3, and RXY4) of the scheduled exposure region corresponds to a region where the workpiece W is irradiated with light of part of the exposure light EL via one exposure element in the first state. Each of the regions (RXY1, RXY2, RXY3, and RXY4) can be rephrased as the predetermined region RX.

For example, the control unit 30 can control the size of the pattern EP1 formed in the predetermined region RXY1 through the development process and the size of the pattern EP3 formed in the region RXY3 through the development process by sequentially controlling the integrated exposure amount of each of the region RXY1 (predetermined region RX) of the scheduled exposure region and the region RXY3 along the axis intersecting the main-scanning axis and the sub-scanning axis with respect to the region RXY1 with light of at least part of each exposure light EL via the plurality of exposure elements (e.g., the exposure elements DM1 and DM2 and the exposure elements DM3 and DM4 illustrated in FIG. 4) in the first state in rows different from one another of the exposure pattern forming apparatus 12 in accordance with the relative movement of the workpiece W and the exposure head HU in the first direction along the main-scanning axis.

After sequentially performing exposure in accordance with the relative movement of the workpiece W and the exposure head HU in the first direction along the main-scanning axis and completing the exposure of the regions RXY1 and RXY2, the control unit 30 controls the driving apparatus 15 to displace the displacement optical system 131 in the direction along the sub-scanning axis. By the control of the control unit 30, the irradiation position of the exposure light EL on the workpiece W moves (e.g., moves by OT in the sub-scanning axis direction as illustrated in FIG. 12) in the direction along the sub-scanning axis. Furthermore, the control unit 30 can control the size of the pattern EP2 formed in the predetermined region RXY2 through the development process and the size of the pattern EP4 formed in the region RXY4 through the development process by relatively moving the pattern EP2 in the second direction opposite to the first direction along the main-scanning axis and similarly controlling the integrated exposure amount of the region RXY2 of the scheduled exposure region and the region RXY4 along the axis intersecting the main-scanning axis and the sub-scanning axis with respect to the region RXY2 with light of at least part of the exposure light EL via the plurality of exposure elements in the first state in rows different from one another.

As described above, by repeating the process of integrating and exposing each region (RXY1 and RXY3) in accordance with the relative movement in the first direction along the main-scanning axis, then displacing the displacement optical system 131 by a predetermined amount in the direction along the sub-scanning axis, and integrating and exposing each region (RXY2 and RXY4) in accordance with the relative movement in the second direction opposite to the first direction along the main-scanning axis, the oblique pattern EPS (oblique pattern including patterns EP1, EP2, EP3, and EP4) can be formed on the workpiece after the development process. In this case, by controlling the integrated exposure amount of each region (RXY1, RXY2, RXY3, and RXY4), the size of each pattern (EP1, EP2, EP3, and EP4) can be made smaller than that of each region (RXY1, RXY2, RXY3, and RXY4), and therefore the oblique pattern EPS having a smooth outline can be formed.

That is, in the present embodiment, the control unit 30 repeats the displacement OT of the displacement optical system 131 and a relative movement of the workpiece W and the exposure head HU along the main-scanning axis, and sequentially irradiates each of the plurality of regions in the scheduled exposure region, in accordance with the relative movement of the workpiece W and the exposure pattern forming apparatus 12, with light of at least part of the exposure light EL via each of the plurality of exposure elements in the first state different from one another, and thus can integrate the exposure amount by irradiation of the light via the plurality of exposure elements in the first state different from one another in each of the plurality of regions to form an exposure region along the axis intersecting the main-scanning axis and the sub-scanning axis.

As described above, the exposure apparatus 1 can form a precise pattern on the workpiece W by controlling the integrated exposure amount of the plurality of regions.

For example, in the embodiment of FIG. 12, the displacement amount OT by which the irradiation position of light of at least part of the exposure light EL to the workpiece W is displaced is, for example, half the width in the sub-scanning axis direction in the region (in other words, one predetermined region RX) in which the workpiece W is irradiated with light of part of the exposure light EL via one exposure element in the first state, but the present disclosure is not limited to this, and the displacement amount is only required to be smaller than the width of the region (in other words, one predetermined region RX) in which the workpiece W is irradiated with light of part of the exposure light EL via one exposure element in the first state. Furthermore, by controlling the magnitude of the displacement amount, it is possible to apply the oblique pattern EPS to be shaped to requirements of various different boundary ranges.

In the present embodiment, the irradiation position on the workpiece (resist) is moved by displacing the displacement optical system 131 to form the oblique pattern EPS. However, the method of displacing the displacement optical system 131 to move the irradiation position on the workpiece is not limited to formation of the oblique pattern EPS, and can be used for formation of a pattern having any shape, for example, a case of forming a plurality of linear patterns along the main-scanning axis direction along the sub-scanning axis direction. The method of displacing the displacement optical system 131 to move the irradiation position on the workpiece and the method of controlling the integrated exposure amount to the predetermined region of the scheduled exposure region by light of at least part of the exposure light EL via the plurality of exposure elements of the exposure pattern forming apparatus 12 can be combined in formation of a pattern having any other shape, in addition to the formation of the oblique pattern EPS.

(1-4-2) Modification: Plurality of Regions

In the above example, the control unit 30 forms the pattern EP having an interval in the predetermined region RX and the region adjacent to the predetermined region RX along the main-scanning axis or the sub-scanning axis, but the present disclosure is not limited to this. In a modification, these need not be adjacent to a plurality of regions different from the predetermined region RX.

Figure 13:
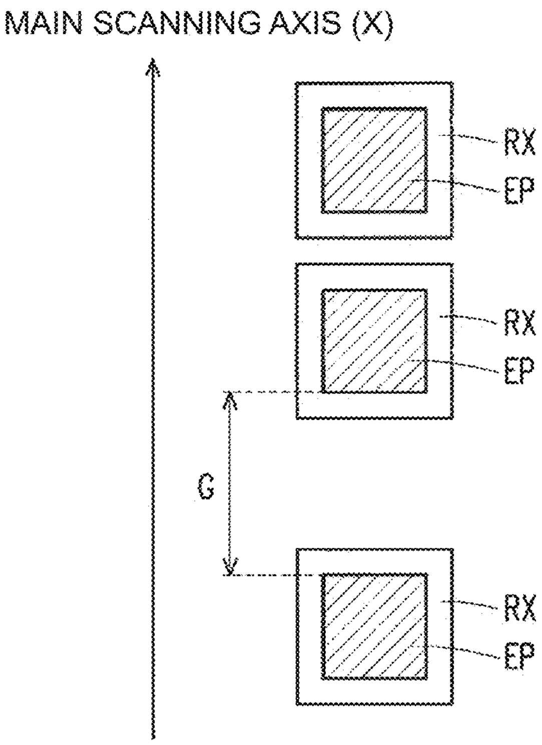
FIG. 13 is an outline explanatory view illustrating a modification of the exposure pattern of the present embodiment.

For example, FIG. 13 is an outline explanatory view illustrating a modification of the exposure pattern of the present embodiment. As illustrated in FIG. 13, the control unit 30 sequentially irradiates the plurality of regions RX different from the predetermined region RX along the main-scanning axis in the scheduled exposure region, in accordance with the relative movement of the workpiece W and the exposure pattern forming apparatus 12, with light of at least part of the exposure light EL via the plurality of exposure elements in the first state different from one another, and thus can integrate the exposure amount by irradiation of the light via the plurality of exposure elements in the first state different from one another in each of the plurality of regions RX to form the exposure region along the main-scanning axis. The plurality of regions RX along the main-scanning axis in the scheduled exposure region are sequentially irradiated with light of at least part of the exposure light EL via the exposure element while the workpiece W and the exposure pattern forming apparatus 12 are relatively moved along the main-scanning axis.

(1-4-3) Modification: Change of Method of Relatively Moving Along Sub-Scanning Axis In the above example, the control unit 30 performs the exposure process by displacing the displacement optical system 131 to irradiate a partial region of the scheduled exposure region along the sub-scanning axis intersecting the main-scanning axis with respect to the predetermined region RX with light of at least part of the exposure light EL via at least one exposure element of the plurality of exposure elements, but the present disclosure is not limited to this.

In one modification, for example, the control unit 30 can also move the substrate stage 20 holding the workpiece W along the sub-scanning axis with respect to the exposure head HU. In this case, the control unit 30 can also relatively move the workpiece W and the exposure pattern forming apparatus 12 (exposure head HU) along the sub-scanning axis so as to irradiate a partial region of a scheduled exposure region along the sub-scanning axis with respect to the predetermined region RX with light of at least part of the exposure light EL via at least one exposure element of the plurality of exposure elements.

More specifically, in the present modification, the control unit 30 repeats the relative movement of the workpiece W and the exposure head HU along the main-scanning axis and the relative movement of the workpiece W and the exposure head HU along the sub-scanning axis, and repeats the exposure process similar to that of the above example. That is, the control unit 30 sequentially irradiates each of the plurality of regions in the scheduled exposure region with light of at least part of the exposure light EL via each of the plurality of exposure elements in the first state different from one another in accordance with the relative movement of the workpiece W and the exposure head HU, and thus integrates the exposure amount by the irradiation of the light via the plurality of exposure elements in the first state different from one another in each of the plurality of regions to form the exposure region along the axis intersecting the main-scanning axis and the sub-scanning axis.

In this manner, the control unit 30 can relatively move the workpiece W and the exposure pattern forming apparatus 12 so as to irradiate a partial region of the scheduled exposure region along the sub-scanning axis intersecting the main-scanning axis with respect to the predetermined region RX with light of at least part of the exposure light EL via at least one exposure element of the plurality of exposure elements, and the exposure apparatus 1 can form the pattern EP and form a pattern of a precise layout on the workpiece W by control of the integrated exposure amount of the plurality of regions and control of the movement on the main-scanning axis and the sub-scanning axis of light of part of the exposure light EL reflected by the exposure element of the exposure pattern forming apparatus 12.

As described above, the exposure apparatus 1 can form a pattern of a precise layout on the workpiece W by control of the integrated exposure amount of the plurality of regions and control of the movement on the main-scanning axis and the sub-scanning axis of light of part of the exposure light EL reflected by the exposure element of the exposure pattern forming apparatus 12.

(2) Exposure Pattern Calculation Method and Defect Exposure Element Compensation Method of the Present Embodiment Next, a method of calculating an exposure pattern formed on the workpiece W and a compensation method for a defect exposure element will be described with reference to FIGS. 14 to 17.

(2-1) Structure of Control Unit 30 (Exposure Pattern Calculation Function Block)

First, a process of forming an exposure pattern will be described with reference to FIG. 1.

In the present embodiment, the control unit 30 includes a central processing unit (CPU) 31, a memory 32, an input unit 33, an operation apparatus 34, and a display apparatus 35.

The CPU 31 calculates the exposure pattern to generate exposure pattern information, and generates corrected exposure pattern information based on the information of the defect exposure element of the exposure pattern forming apparatus 12. Here, the information regarding the defect exposure element is, for example, information on the position of the defect exposure element among the plurality of exposure elements in the exposure pattern forming apparatus 12 (e.g., the ID of the defect exposure element and the coordinates of the defect exposure element in the exposure pattern forming apparatus 12). The CPU 31 calculates the layout of the exposure pattern and controls the order and timing of bringing the plurality of exposure elements into the first state (on state). Specifically, the CPU 31 solves an optimization problem or a mathematical programming problem for calculating an exposure pattern that satisfies a necessary calculation condition, thereby calculating the exposure pattern. Specific examples of the necessary calculation condition include conditions for optimizing (what is called process window optimization) an exposure amount (DOSE amount) and a depth of focus (DOF).

The CPU 31 can also substantially exert a function as an electronic design automation (EDA) tool. For example, the CPU 31 can also exert a function as the EDA tool by executing a computer program for causing the CPU 31 to execute a calculation operation of an exposure pattern.

The memory 32 saves the computer program for causing the CPU 31 to execute the calculation operation of the exposure pattern. However, the computer program for causing the CPU 31 to execute the calculation operation of the exposure pattern can also be recorded in an external memory device (e.g., a hard disk or an optical disk) or the like. The memory 32 further temporarily stores intermediate data generated during the calculation operation of the exposure pattern by the CPU 31.

The input unit 33 receives input of various data for causing the CPU 31 to execute the calculation operation of the exposure pattern. For example, the input unit 33 may receive input of exposure pattern information indicating the exposure pattern to be formed on the workpiece W, information of a defect exposure element of the exposure pattern forming apparatus 12, and the like.

The operation apparatus 34 receives a user's operation on the control unit 30. The operation apparatus 34 includes at least one of, for example, a keyboard, a mouse, and a touchscreen. The CPU 31 can also execute the calculation operation of the exposure pattern in response to the user's operation received by the operation apparatus 34. However, there is a case where the control unit 30 does not include the operation apparatus 34.

The display apparatus 35 can display necessary information. For example, the display apparatus 35 can also directly or indirectly display information indicating the state of the control unit 30. For example, the display apparatus 35 can also directly or indirectly display the exposure pattern calculated by the control unit 30. For example, the display apparatus 35 can also directly or indirectly display arbitrary information related to the calculation operation of the exposure pattern. However, there is a case where the control unit 30 does not include the display apparatus 35.

Figure 14:
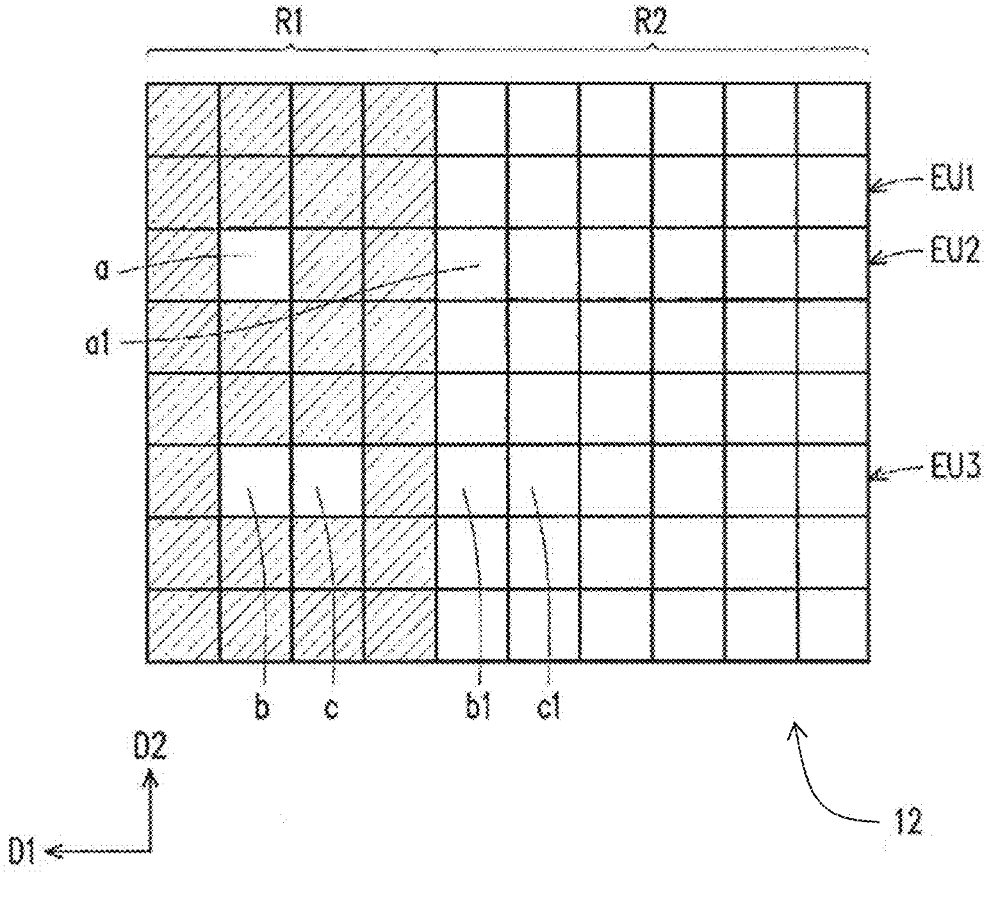
FIG. 14 is an explanatory view illustrating a position distribution of a defect element of the exposure pattern forming apparatus of the present embodiment.

(2-2) Calculation Operation of Exposure Pattern and Compensation of Defect Exposure Element Next, the calculation operation of the exposure pattern executed by the control unit 30 will be described with reference to FIGS. 14 and 15. FIG. 14 is an explanatory view illustrating the position of a defect exposure element in the exposure pattern forming apparatus 12 of the present embodiment. FIG. 15 is an explanatory view illustrating the exposure process of a different exposure element of the exposure pattern forming apparatus 12 of the present embodiment to a corresponding scheduled exposure region. Note that the defect exposure element includes, for example, an exposure element that is disabled to switch between the first state (on state) and the second state (off state) due to a failure, and damaged or missing exposure element.

In the present embodiment, the CPU 31 included in the control unit 30 generates exposure pattern information indicating the exposure pattern. Specifically, the exposure pattern information is data representing the content (i.e., the pattern layout) of the exposure pattern calculated so as to satisfy a prescribed design rule, and includes information regarding the position of the scheduled exposure region on the workpiece and information regarding the integrated exposure amount in each region of the scheduled exposure region.

Then, the control unit 30 switches at least part of exposure elements of the plurality of exposure elements to the first state or the second state in accordance with the relative movement of the workpiece W and the exposure pattern forming apparatus 12 based on the exposure pattern information.

Based on the information of the defect exposure element in the plurality of exposure elements, the control unit 30 irradiates the predetermined region RX, in accordance with the relative movement of the workpiece W and the exposure pattern forming apparatus 12, with light of part of the exposure light EL via the exposure element in the first state other than the defect exposure element among the plurality of exposure elements so that the integrated exposure amount of the predetermined region RX of the scheduled exposure region becomes the predetermined exposure amount.

In a case where at least one exposure element of a first portion of exposure elements among the plurality of exposure elements included in the exposure pattern forming apparatus 12 is a defect exposure element, a second portion of exposure elements different from the first portion among the plurality of exposure elements is used for exposure so that the integrated exposure amount of the predetermined region RX becomes a predetermined exposure amount instead of the defect exposure element.

In a case where part of the first portion and part of the second portion are included in the same row among the plurality of exposure elements, and at least one exposure element among the exposure elements of the part of the first portion in the row is a defect exposure element, the predetermined region RX is irradiated with light of part of the exposure light EL via at least one exposure element among the exposure elements of the part of the second portion in the row instead of the defect exposure element in accordance with the relative movement of the workpiece W and the exposure pattern forming apparatus 12.

For example, in the present embodiment, as illustrated in FIG. 14, when there is a defect in part of exposure elements a, b, and c (in other words, at least one exposure element of the first portion of exposure elements of the plurality of exposure elements included in the exposure pattern forming apparatus 12) in a first region R1 of the exposure pattern forming apparatus 12 (i.e., when the exposure elements a, b, and c are defect exposure elements), the predetermined region RX of the workpiece W cannot be irradiated with the exposure light EL via the defect as scheduled, and therefore the exposure amount of the predetermined region RX (exposure pattern) of the workpiece W becomes insufficient. In this case, the control unit 30 can perform control to irradiate the predetermined region RX with the exposure light EL using part of exposure elements a1, b1, and c1 (in other words, the second portion exposure elements of the plurality of exposure elements included in the exposure pattern forming apparatus 12) in a second region R2 of the exposure pattern forming apparatus 12 instead of the defect exposure elements a, b, and c. That is, the exposure element in the second region R2 of the exposure pattern forming apparatus 12 can be used as an alternative to the defect exposure element in the first region R1 of the exposure pattern forming apparatus 12. Note that the exposure element in the second region R2 of the exposure pattern forming apparatus 12 is not used for irradiation (exposure) of the exposure light EL in a case where there is no defect exposure element in the exposure element in the first region R1 of the exposure pattern forming apparatus 12, and may be used as a preliminary exposure element to be used for irradiation (exposure) of the exposure light EL instead of the defect exposure element in a case where the defect exposure element is included in the first region R1 of the exposure pattern forming apparatus 12.

Figure 15A:
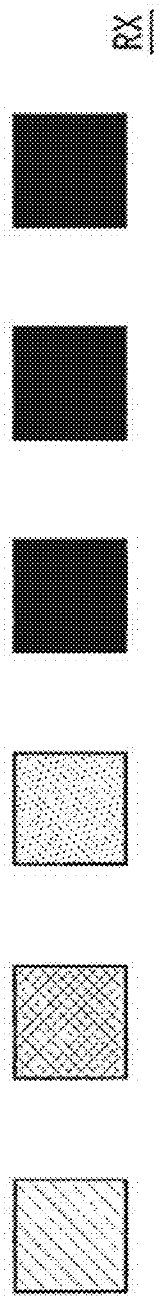
FIGS. 15A to 15C each depict an explanatory view illustrating an exposure process in corresponding scheduled exposure regions of different exposure elements of the exposure pattern forming apparatus of the present embodiment.
Figure 15B:
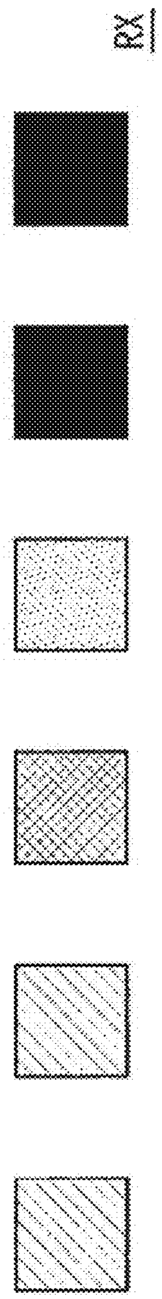
Figure 15C:
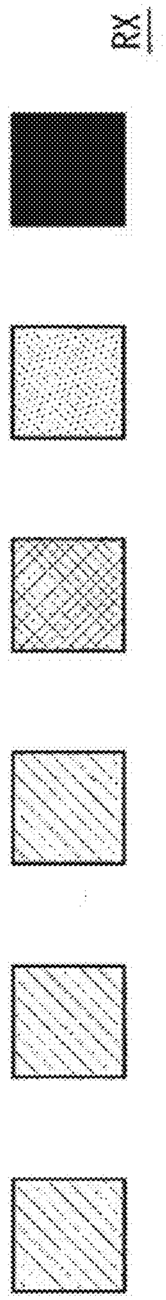

Next, with reference to FIGS. 15A to 15C, FIG. 15A illustrates the exposure process of the predetermined region RX corresponding to an exposure element EU1 of the first row having no defect in the exposure pattern forming apparatus 12, FIG. 15B illustrates the exposure process of the predetermined region RX corresponding to an exposure element EU2 of the second row including the exposure element a having a defect in the exposure pattern forming apparatus 12, and FIG. 15C illustrates the exposure process of the predetermined region RX corresponding to an exposure element EU3 of the third row including the exposure elements b and c having a defect in the exposure pattern forming apparatus 12. Note that any of the figures in FIGS. 15A to 15C is a view illustrating a concept in which the exposure amount to the predetermined region RX is integrated by sequentially irradiating the one predetermined region RX with the exposure light EL via the plurality of exposure elements in the same row in accordance with the relative movement of the workpiece W and the exposure pattern forming apparatus 12.

As illustrated in FIG. 15A, since the exposure element EU1 in the first row has no defect exposure element, light of at least part of the exposure light EL via the exposure element in the first region R1 of the exposure element EU1 in the first row in the first state sequentially irradiates the corresponding predetermined region RX, and then the integrated exposure amount of the corresponding predetermined region RX becomes a desired amount. On the other hand, as illustrated in FIG. 15B, the exposure element EU2 in the second row has the defect exposure element a. Since the predetermined region RX of the workpiece W cannot be irradiated with the exposure light EL via the defect exposure element a as scheduled, the integrated exposure amount to the predetermined region RX corresponding to the defect exposure element a does not increase. On the other hand, it is possible to perform control so as to irradiate the predetermined region RX with the exposure light EL using the exposure element a1 in the second region R2 of the exposure pattern forming apparatus 12. Therefore, the predetermined region RX can be irradiated with light of at least part of the exposure light EL via the exposure element a1 in the first state, and the integrated exposure amount to the predetermined region RX increases. Accordingly, by irradiating the predetermined region RX corresponding to the exposure element a1 in the second region R2 of the exposure pattern forming apparatus 12 instead of the defect exposure element a, the integrated exposure amount of the predetermined region RX becomes a desired amount.

Similarly, the exposure elements EU3 in the third row have the defect exposure elements b and c. Since the predetermined region RX of the workpiece W cannot be irradiated with the exposure light EL via the defect exposure elements b and c as scheduled, the integrated exposure amount to the predetermined region RX corresponding to the defect exposure elements b and c does not increase. On the other hand, it is possible to perform control so as to irradiate the predetermined region RX with the exposure light EL using the exposure elements b1 and c1 in the second region R2 of the exposure pattern forming apparatus 12. Therefore, the predetermined region RX can be irradiated with light of at least part of the exposure light EL via the exposure elements b1 and c1 in the first state, and the integrated exposure amount to the predetermined region RX increases. Thus, the exposure elements b1 and c1 in the second region R2 of the exposure pattern forming apparatus 12 instead of the defect exposure elements b and c sequentially irradiate the corresponding predetermined region RX, and therefore the integrated exposure amount of the predetermined region RX becomes a desired amount.

As described above, in a case where there is a defect exposure element of the exposure pattern forming apparatus 12, compensation can be performed using another normal exposure element of the exposure pattern forming apparatus 12, and therefore a desired integrated exposure amount can be applied to the scheduled exposure region on the workpiece W, and eventually, a desired pattern can be formed.

(2-3) Detection Optical System 50 of the Present Embodiment

In the present embodiment, the exposure apparatus 1 can be provided with a detection optical system 50, and the detection optical system 50 can be provided with a detection unit DU. The detection unit DU detects an intensity distribution of light of at least part of the exposure light EL via at least a part of the plurality of exposure elements, and the control unit 30 generates information regarding the defect exposure elements including information on the position of the defect exposure elements two-dimensionally arrayed based on the light intensity distribution detected by the detection unit DU. For example, the control unit 30 can perform control so that detection light DL is formed by at least part of the exposure light EL of the exposure pattern forming apparatus 12 and the detection unit DU is arranged on the optical path of the detection light DL. As described above, the detection unit DU can detect the light intensity distribution of the detection light DL and acquire, for example, information regarding the position of the defect exposure element as the information on the defect exposure elements two-dimensionally arrayed of the exposure pattern forming apparatus 12, and the detection unit DU is electrically connected to the control unit 30, and can feed back the information on the defect exposure element and save the information in the control unit 30. Note that the detection unit DU may be an imaging element such as a CCD or a CMOS, or may be another existing light detection apparatus. Note that the exposure apparatus 1 need not be provided with the detection unit DU. For example, by using an inspection apparatus provided separately from the exposure apparatus 1 and irradiating each exposure element in the on state of the exposure pattern forming apparatus 12 with light by an existing method and detecting the intensity of light from each exposure element in the on state of the exposure pattern forming apparatus 12, information on the defect exposure element may be generated with the exposure element in which the detected intensity of light is equal to or less than a threshold as the defect exposure element. Then, the generated information on the defect exposure element may be input to the control apparatus 30 via the input unit 33. Note that the present disclosure is not limited to this method, and information on the defect exposure element may be generated using another existing method.

Figure 16:
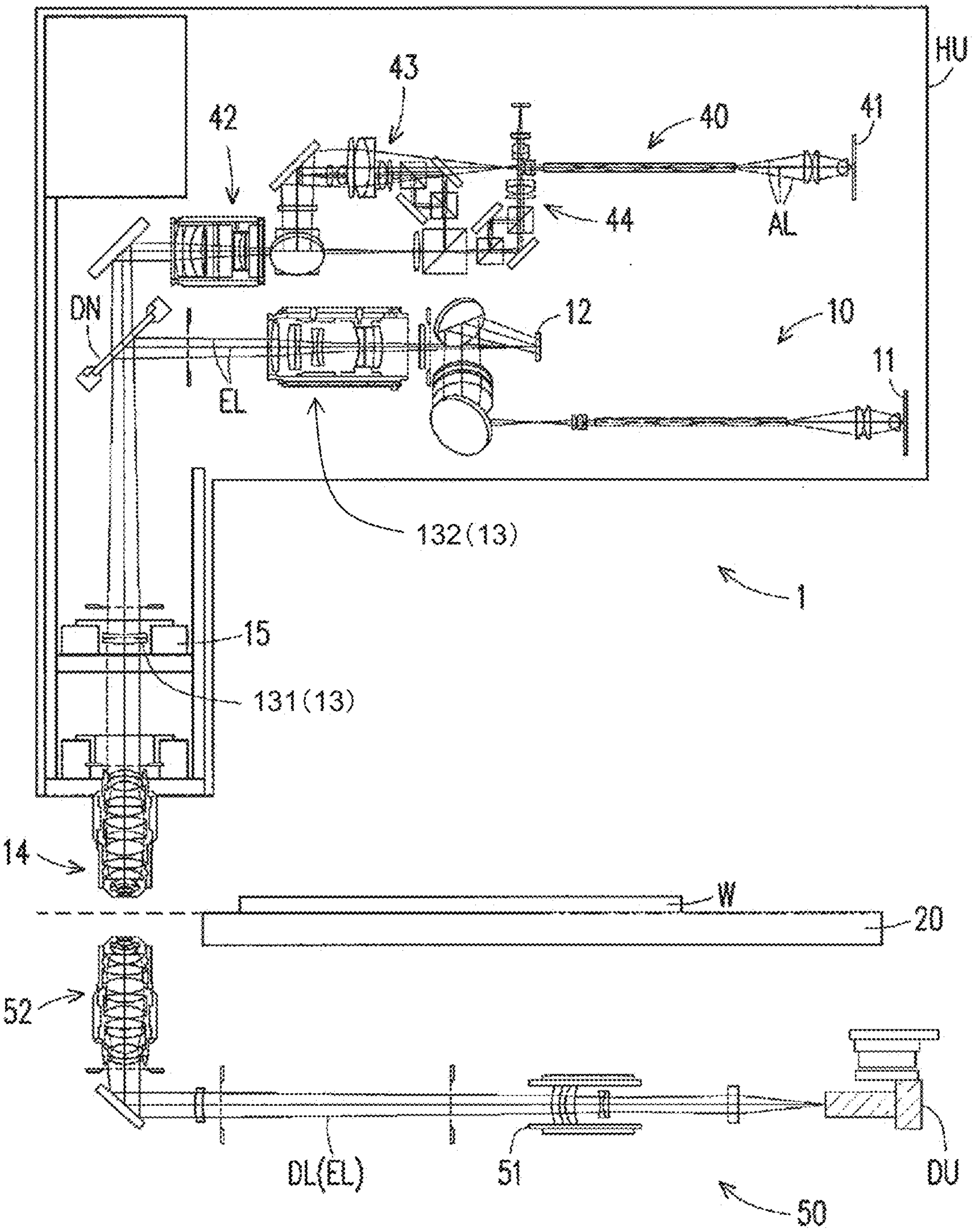
FIG. 16 is a structure explanatory view illustrating an example of a detection optical system of the present embodiment.
Figure 17:
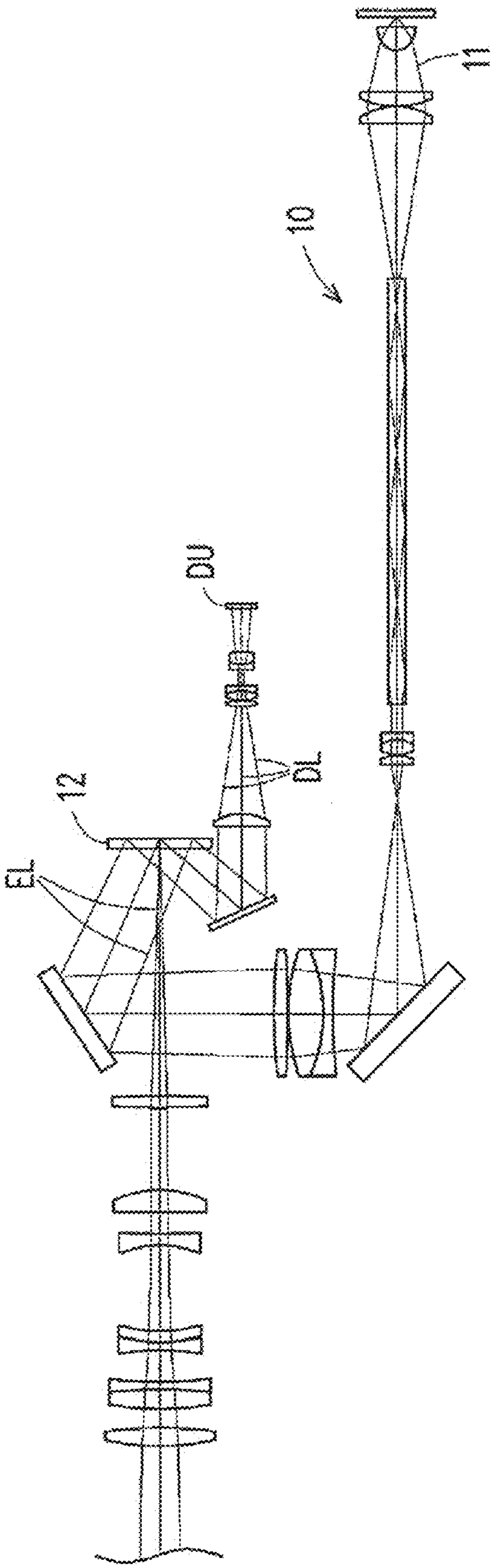
FIG. 17 is a structure explanatory view illustrating another example of the detection optical system of the present embodiment.

Next, a different example of the detection optical system 50 of the present embodiment will be described with reference to FIGS. 16 and 17. FIG. 16 is a structure explanatory view illustrating an example of the detection optical system 50 of the present embodiment. FIG. 17 is a structure explanatory view illustrating another example of the detection optical system 50 of the present embodiment.

As illustrated in FIG. 16, the exposure apparatus 1 of an example of the present embodiment further includes the detection optical system 50, and the detection optical system 50 includes a detection collimator optical system 51, a detection objective optical system 52 having the same structure as the objective optical system 14, and the detection unit DU.

Before the exposure apparatus 1 executes the exposure process, the control unit 30 of the exposure apparatus 1 of the present embodiment moves the exposure head HU out of the range of the substrate stage 20, causes the objective optical system 14 mounted on the exposure head HU to align with the detection objective optical system 52 of the detection optical system 50, and the control unit 30 arranges the detection objective optical system 52 symmetrically with the objective optical system 14 with respect to the horizontal plane. In this manner, the detection collimator optical system 51 and the detection objective optical system 52 are arranged on the optical path of the exposure light EL from the objective optical system 14. The magnitude of the light refractive power of the combination of the collimating optical system 13 and the objective optical system 14 and that of the combination of the detection collimator optical system 51 and the detection objective optical system 52 are the same, but the positive and negative are opposite. In other words, the optical effect of the combination of the detection collimator optical system 51 and the detection objective optical system 52 is substantially opposite to the optical effect of the combination of the collimating optical system 13 and the objective optical system 14, and can be used to restore the imaging information of the exposure light EL via the exposure pattern forming apparatus 12.

The control unit 30 brings all the exposure elements of the exposure pattern forming apparatus 12 into the first state (on state), and performs control so as to form an image on the detection unit DU after sequentially passing the exposure light EL via the first state through the collimating optical system 13, the objective optical system 14, the detection objective optical system 52, and the detection collimator optical system 51. Note that in a case where the exposure light EL from the objective optical system 14 is incident on the detection optical system 50 (detection objective optical system 52), the incident exposure light EL becomes light detected by the detection unit DU. Therefore, the exposure light EL incident on the detection optical system 50 can be rephrased as the detection light DL. In this way, the information of the light intensity distribution of the exposure light EL by the exposure pattern forming apparatus 12 can be obtained, and in a case where at least one of the plurality of exposure elements of the exposure pattern forming apparatus 12 is a defect exposure element, the intensity of a part of the light intensity distribution detected by the detection unit DU becomes equal to or less than a predetermined threshold. In this way, the information (e.g., information regarding the position of the defect exposure element) on the defect exposure elements two-dimensionally arrayed of the exposure pattern forming apparatus 12 can be acquired.

As illustrated in FIG. 16, the detection unit DU can be arranged at a rear end of the optical path at the above-described primary image forming position, and an image can be formed on the detection unit DU by an image forming lens arranged in front of the detection unit DU. This image forming lens can be used to adjust the size of the image formed by the exposure light EL correspondingly, and the size of the image formed by the exposure light EL can correspond to the size of a detection surface of the detection unit DU. For example, when the overall size of the exposure pattern forming apparatus 12 is larger than the size of the detection surface of the detection unit DU, the image forming lens can be designed to reduce the size of the image formed by the exposure light EL. When the overall size of the exposure pattern forming apparatus 12 is smaller than the size of the detection surface of the detection unit DU, the image forming lens can be designed to enlarge the size of the image formed by the exposure light EL. In a case where the overall size of the exposure pattern forming apparatus 12 is equal to the size of the detection surface of the detection unit DU, the image forming lens can be designed so as not to adjust the size of the image formed by the exposure light EL, or the detection surface of the detection unit DU can be directly arranged at the primary image forming position after the exposure light EL passes through the collimating optical system 13, the objective optical system 14, the detection objective optical system 52, and the detection collimator optical system 51 in order, and it is possible to eliminate need for separately installing the image forming lens.

On the other hand, before the exposure apparatus 1 performs the exposure process, the exposure apparatus 1 of the above example acquires the information on the defect exposure element of the exposure pattern forming apparatus 12, but in the exposure apparatus 1 of another example, the detection unit DU is installed next to the exposure pattern forming apparatus 12 of the exposure apparatus 1, and can be used to acquire the information regarding the position of the defect exposure elements arranged two-dimensionally simultaneously with the exposure apparatus 1 executing the exposure process.

As illustrated in FIG. 17, simultaneously with the exposure apparatus 1 executing the exposure process, the exposure light EL via the plurality of exposure elements in the second state (off state) of the exposure pattern forming apparatus 12 is detected by the detection unit DU arranged on the optical path via the existing optical system as the detection light DL. Then, the detection unit DU acquires the light intensity distribution of the detected detection light DL. The detection unit DU inputs the acquired light intensity distribution of the detection light DL to the control unit 30. Here, the control unit 30 compares the light intensity distribution of the detection light DL with predetermined exposure pattern information, and in a case where the two are complementary, it indicates that the first state (on state) and the second state (off state) of the exposure element controlled by the control unit 30 coincide with the state necessary for forming the exposure pattern, and the defect exposure element does not exist. On the other hand, when they are not complementary to each other, it indicates that the first state (on state) and the second state (off state) of the exposure element controlled by the control unit 30 do not coincide with the state necessary for forming the exposure pattern, and at this time, it indicates that the defect exposure element exists in the exposure pattern forming apparatus 12. In this manner, the control unit 30 can acquire information on the defect exposure element.

(3) Countermeasure Against Unevenness of the Present Embodiment

Figure 18:
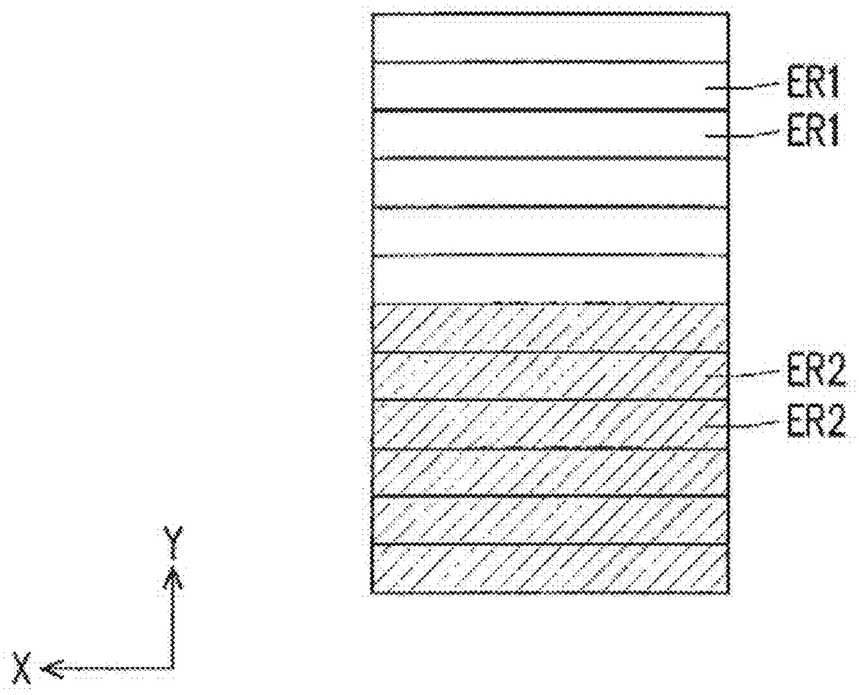
FIG. 18 is a structure explanatory view illustrating an example of an exposure pattern formed in scheduled exposure regions corresponding to different exposure elements of the present embodiment.
Figure 19:
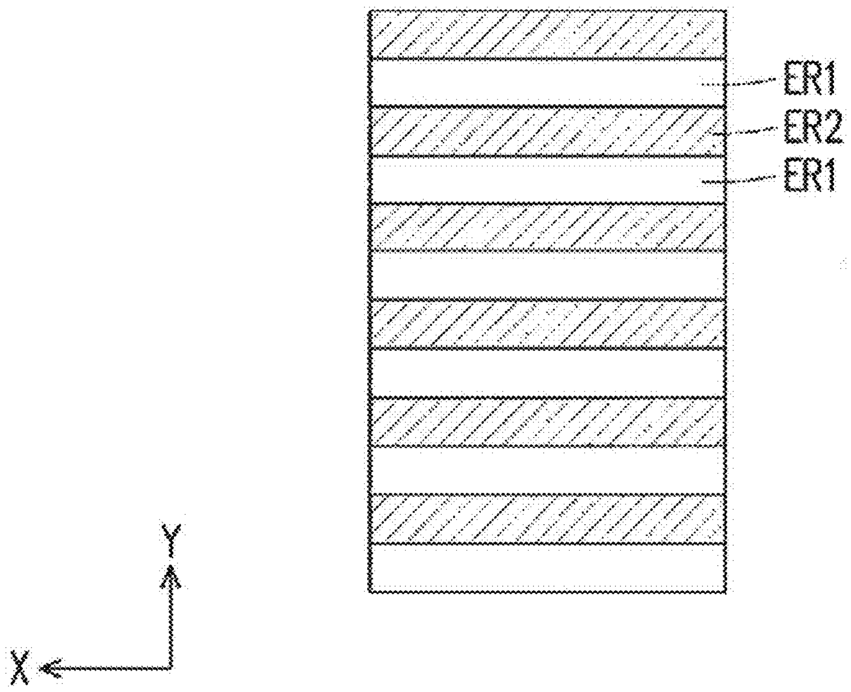
FIG. 19 is a structure explanatory view illustrating an example of an exposure pattern formed in scheduled exposure regions corresponding to different exposure elements of the present embodiment.
Figure 20:
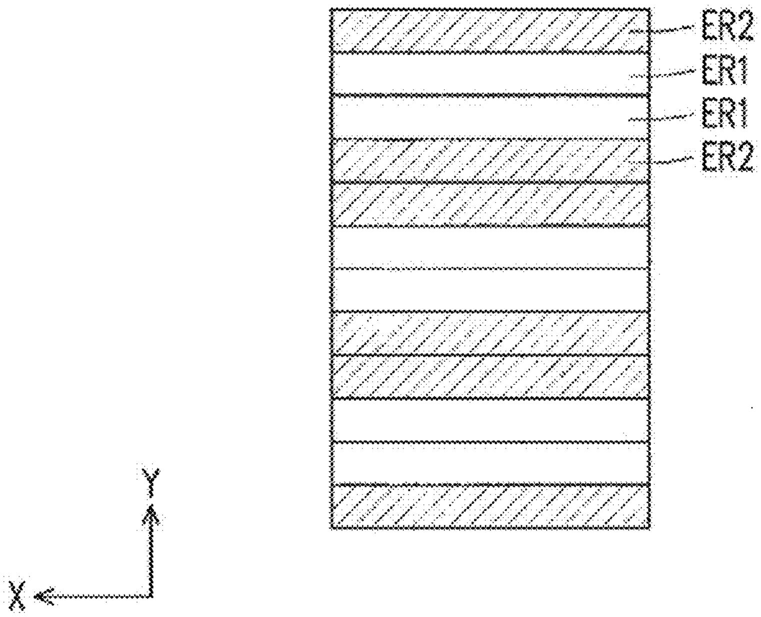
FIG. 20 is a structure explanatory view illustrating an example of an exposure pattern formed in scheduled exposure regions corresponding to different exposure elements of the present embodiment.

Next, the countermeasure against unevenness of the present embodiment will be described with reference to FIGS. 18 to 20. FIG. 18 is a structure explanatory view illustrating an example of an exposure pattern formed in scheduled exposure regions corresponding to different exposure heads in a known exposure method. FIG. 19 is a structure explanatory view illustrating an example of an exposure pattern formed in scheduled exposure regions corresponding to different exposure heads of the present embodiment. FIG. 20 is a structure explanatory view illustrating another example of an exposure pattern formed in scheduled exposure regions corresponding to different exposure heads of the present embodiment.

For example, when the exposure apparatus 1 has a plurality of exposure heads HU, each of the exposure heads HU corresponds to a different scheduled exposure region on the workpiece W, and forms a desired exposure pattern thereon. After each of the exposure heads HU of the exposure apparatus 1 completes the desired exposure pattern of one scheduled exposure region, the control unit 30 moves, relative to the sub-scanning axis, the exposure head HU in which the workpiece W and the exposure pattern forming apparatus 12 are arranged, and starts exposure of another scheduled exposure region corresponding to this exposure head HU. In this way, after the exposure of the different scheduled exposure region corresponding to this exposure head HU is continuously repeated, desired exposure patterns of all the scheduled exposure regions on the workpiece W can be completed.

However, when the scheduled exposure region is exposed using the different exposure head HU, the characteristics of the exposure pattern to be formed become also different due to the difference in the characteristics between the exposure pattern forming apparatuses 12 of the exposure heads HU different from one another. For example, the distribution of the exposure amounts given to the respective scheduled exposure regions using the exposure pattern forming apparatuses 12 of the exposure heads HU different from one another is different. When the distribution of the exposure amount given to this scheduled exposure region is different, the shape of the pattern formed through development is also changed. Therefore, as illustrated in FIG. 18, when the plurality of scheduled exposure regions corresponding to the same exposure head HU are connected to each other on the sub-scanning axis, in a pattern block formed by exposure and development to these scheduled exposure regions, the block of the exposure pattern having the coincident characteristics to be formed also becomes large, and the shape change of the pattern formed through development is also easily recognized. As described above, in a case where the distributions of the exposure amounts in the scheduled exposure regions given to the respective scheduled exposure regions are different using the exposure pattern forming apparatuses 12 of the exposure heads HU different from one another, visual unevenness is more easily recognized due to the shape change of the pattern formed through development. Note that as described later, in FIG. 18, an exposure region scheduled to be exposed by the first exposure head is represented as a first scheduled exposure region ER1, and an exposure region scheduled to be exposed by the second exposure head is represented as a second scheduled exposure region ER2.

On the other hand, in the present embodiment, the possibility that the shape change of the exposure pattern formed by the exposure heads HU different from one another is recognized can be reduced by the design in which the scheduled exposure regions corresponding to the different exposure heads HU are alternately arranged.

For example, as illustrated in FIG. 19, the exposure apparatus of the present embodiment includes the first exposure head mounted with the exposure optical system 10 including the exposure pattern forming apparatus 12 and the second exposure head mounted with the exposure optical system 10 including the exposure pattern forming apparatus 12. The first exposure head is used to irradiate the first scheduled exposure region ER1 of the workpiece W correspondingly with light of at least part of the exposure light EL, and the second exposure head is used to irradiate the second scheduled exposure region ER2 of the workpiece W correspondingly with light of at least another part of the exposure light EL. The first scheduled exposure region ER1 and the second scheduled exposure region ER2 extend along the main-scanning axis and are arranged side by side along the sub-scanning axis orthogonal to the main-scanning axis, the control unit 30 continues to relatively move the first exposure head and the second exposure head in which the workpiece W and the exposure pattern forming apparatus 12 are arranged on the main-scanning axis to irradiate one first scheduled exposure region ER1 and one second scheduled exposure region ER2 with the exposure light EL, and, after the above process, the control unit 30 relatively moves the first exposure head and the second exposure head in which the workpiece W and the exposure pattern forming apparatus 12 are arranged on the sub-scanning axis, then the control unit 30 irradiates another first scheduled exposure region ER1 and another second scheduled exposure region ER2 with light of a plurality of parts of the exposure light EL.

Furthermore, as illustrated in FIG. 19, an arbitrary second scheduled exposure region ER2 is positioned between two first scheduled exposure regions ER1. For example, in the above arrangement forming method, when the interval between the first exposure head and the second exposure head is wider than the interval between the first scheduled exposure region ER1 and the second scheduled exposure region ER2, the first exposure head repeats exposing the first scheduled exposure region ER1 by moving in the first direction of the main-scanning axis, moving in the sub-scanning axis direction, and exposing another first scheduled exposure region ER1 by moving in the second direction opposite to the first direction of the main-scanning axis.

The control unit 30 controls the interval between the two first scheduled exposure regions ER1 so as to correspond to the width (size) of the one second scheduled exposure region ER2. By exposing a part corresponding to this second scheduled exposure region by movement of the main-scanning axis in the first direction, the second exposure head can complete exposure to the second scheduled exposure region ER2 adjacent to the two first scheduled exposure regions ER1. Next, the second exposure head moves in the sub-scanning axis direction, and repeats exposing the next second scheduled exposure region ER2 in the interval between another two first scheduled exposure regions ER1 by the movement of the main-scanning axis in the second direction opposite to the first direction. As described above, as illustrated in FIG. 19, the scheduled exposure regions corresponding to the different exposure heads are alternately arranged on the workpiece W, and therefore the visual nonuniformity of the shape change of the entire exposure pattern formed through development can be averaged, whereby appearance of visually recognizable defects (unevenness) can be avoided.

In the present embodiment, a part of the scheduled exposure region corresponding to the same exposure head HU can be appropriately connected, and the visual nonuniformity of the formed entire exposure pattern can be averaged as long as the region formed by the scheduled exposure region of the connected portion is smaller than a certain degree of width. For example, as illustrated in FIG. 20, in another example of the present embodiment, a first scheduled exposure region ER1 is adjacent to another first scheduled exposure region ER1 to form a first scheduled exposure region group, and an arbitrary first scheduled exposure region group is positioned between two of the second scheduled exposure regions ER2. For example, similarly, the first exposure head repeats exposing the first scheduled exposure region ER1 by the movement of the main-scanning axis in the first direction, moving in the sub-scanning axis direction, and exposing another first scheduled exposure region ER1 by the movement of the main-scanning axis in the second direction opposite to the first direction. The control unit 30 performs control so that the first scheduled exposure region ER1 is adjacent to another first scheduled exposure region ER1 to form the first scheduled exposure region group, and the interval between the two first scheduled exposure region groups corresponds to the width of the two second scheduled exposure regions.

Note that the second exposure head exposes the interval between these two first scheduled exposure region groups by movement of the main-scanning axis in the first direction, and completes exposure to the one second scheduled exposure region ER2 adjacent to the one first scheduled exposure region ER1. Next, the second exposure head moves in the sub-scanning axis direction, exposes an unexposed part in the interval between the first scheduled exposure regions ER1 by the movement of the main-scanning axis in the second direction opposite to the first direction, and exposes another second scheduled exposure region ER2 adjacent to the second scheduled exposure region. Next, the second exposure head moves in the sub-scanning axis direction, and repeats exposing the next second scheduled exposure region ER2 in the interval between another two first scheduled exposure region groups by the movement to the main-scanning axis.

As described above, as illustrated in FIG. 20, since the different exposure heads HU can be locally and alternately arranged in the corresponding scheduled exposure region, the visual nonuniformity of the shape change of the entire exposure pattern formed through development can be averaged, and the appearance of visually recognizable defects (unevenness) can be avoided.

In the present embodiment, the exposure apparatus 1 can form connection or separation of exposure patterns in different predetermined regions RX by controlling the integrated exposure amount to each predetermined region RX of the scheduled exposure region, and thus can form a pattern of a precise layout on the workpiece W. The exposure apparatus 1 can form a pattern of a more precise layout on the workpiece W by controlling the movement on the sub-scanning axis of the exposure light EL reflected by the exposure element of the exposure pattern forming apparatus 12 by the displacement optical system 131. Furthermore, by controlling the exposure elements in different regions of the exposure pattern forming apparatus, the exposure apparatus can complete irradiation of the defect region of the exposure pattern in the predetermined region RX, and can form a desired exposure pattern in the scheduled exposure region on the workpiece W. By alternately arranging the designs of the scheduled exposure regions corresponding to the different exposure heads HU (i.e., different exposure pattern forming apparatuses), the exposure apparatus can reduce the possibility that the shape change of the entire exposure pattern formed through development by the different exposure heads HU (i.e., different exposure pattern forming apparatuses) is recognized, and appearance of visually recognizable defects (unevenness) can be avoided.

Although the description has been described as the above examples, this is not intended to limit the present disclosure, and changes or modifications can be made by those skilled in the art without departing from the scope of the spirit of the present disclosure, and therefore the protection scope of the present disclosure is based on what is defined in the following claims.

For example, in the present embodiment, the exposure pattern forming apparatus 12 is exemplified in the form of a digital micromirror device, but in another embodiment, the exposure pattern forming apparatus 12 may be another type of spatial light modulator (SLM), and for example, the exposure pattern forming apparatus 12 may be a light-reflective liquid-crystal-on-silicon panel (LCOS panel), a light-transmissive liquid-crystal panel, or another light modulator. Any type of spatial light modulator has a plurality of exposure pixels. The state of each exposure pixel can be switched between the first state (on state) and the second state (off state). In the first state, light of at least part of the exposure light EL via the exposure element in the first state is incident on the workpiece W, and in the second state, light of at least part of the exposure light EL via the exposure element in the first state is not incident on the workpiece W.

In the above-described examples, the direction in which the displacement optical system 131 is displaced is the direction of the sub-scanning axis, but in another example, the direction in which the displacement optical system 131 is displaced need not be the sub-scanning axis.

In the above example, the substrate stage 20 is movable along the X axis direction and the Y axis direction. However, in another example, instead of or in addition to movement of the substrate stage 20, the substrate stage may be movable along the X axis direction and the Y axis direction in a state where the exposure head HU holds the exposure optical system 10 and the autofocus optical system 40. For example, the exposure head HU can move along the X axis direction by operation of the exposure head driving system including an arbitrary motor. The exposure head HU is movable in at least one of the Y axis direction and the Z axis direction in addition to being movable in the X axis direction.

The present disclosure provides an exposure apparatus capable of precise pattern shaping.

The present disclosure can be realized also as the aspects as follows. In the embodiment of the present disclosure, the control unit may control an integrated exposure amount in the predetermined region of the scheduled exposure region based on the number of exposure elements in the first state that sequentially irradiate the predetermined region with light of part of the exposure light in accordance with a relative movement of the workpiece and the exposure pattern forming apparatus.

In the embodiment of the present disclosure, the control unit may control an integrated exposure time in the predetermined region based on the number of exposure elements in the first state.

In the embodiment of the present disclosure, the control unit may control a width of a pattern formed in the predetermined region through an exposure process by the exposure light to the predetermined region by controlling an integrated exposure amount in the predetermined region.

In the embodiment of the present disclosure, a light amount of a center part in a region where the scheduled exposure region is irradiated with light of part of the exposure light via an exposure element of the plurality of exposure elements may be larger than a light amount of a peripheral part in the irradiated region.

In the embodiment of the present disclosure, the exposure pattern forming apparatus may be a digital mirror device, and the exposure element may be a mirror element having a reflection surface that reflects light of part of the exposure light.

In the embodiment of the present disclosure, the control unit may integrate an exposure amount in the predetermined region of the scheduled exposure region by sequentially irradiating the predetermined region with light of part of the exposure light via a first exposure element in the first state and light of part of the exposure light via a second exposure element in the first state while relatively moving the workpiece and the exposure pattern forming apparatus.

An embodiment of the present disclosure may further include: a collimating optical system that concentrates light of at least part of the exposure light from the exposure pattern forming apparatus; an objective optical system that concentrates light of at least part of the exposure light exiting the collimating optical system toward the workpiece; and a driving apparatus that displaces part of optical members of the collimating optical system along an axis intersecting an optical axis of the objective optical system.

In the embodiment of the present disclosure, the control unit may integrate an exposure amount in the predetermined region by sequentially irradiating the predetermined region with light of part of the exposure light via the first exposure element in the first state and light of part of the exposure light via the second exposure element in the first state in accordance with a relative movement along a main-scanning axis of the workpiece and the exposure pattern forming apparatus; and may further control the driving apparatus to displace the part of optical members along an axis intersecting the optical axis so that part of a region of the scheduled exposure region along a sub-scanning axis intersecting the main-scanning axis with respect to the predetermined region is irradiated with light of at least part of the exposure light via at least one exposure element of the plurality of exposure elements.

In the embodiment of the present disclosure, the plurality of exposure elements of the exposure pattern forming apparatus may be two-dimensionally arrayed, and the driving apparatus may displace the part of optical members along an axis intersecting the optical axis so that an irradiation position of light of at least part of the exposure light is displaced at an irradiation interval smaller than an irradiation interval of light of at least part of the exposure light in the scheduled exposure region corresponding to an interval between adjacent exposure elements two-dimensionally arrayed.

In the embodiment of the present disclosure, the sub-scanning axis may be an axis orthogonal to the main-scanning axis, and the control unit may repeat displacement of the part of optical members along an axis intersecting the optical axis and a relative movement of the workpiece and the exposure pattern forming apparatus along the main-scanning axis, and may sequentially irradiate each of a plurality of regions in the scheduled exposure region, in accordance with the relative movement of the workpiece and the exposure pattern forming apparatus, with light of at least part of the exposure light via each of the plurality of exposure elements in the first state different from one another, and thus an exposure amount may be integrated by irradiation of the light via the plurality of exposure elements in the first state different from one another in each of the plurality of regions to form an exposure region along an axis intersecting the main-scanning axis and the sub-scanning axis.

In the embodiment of the present disclosure, the control unit may relatively move the workpiece and the exposure pattern forming apparatus along a main-scanning axis; may further relatively move the workpiece and the exposure pattern forming apparatus along a sub-scanning axis intersecting the main-scanning axis; and may integrate an exposure amount by sequentially irradiating a partial region of the scheduled exposure region along the sub-scanning axis with respect to the predetermined region, in accordance with a relative movement along the sub-scanning axis of the workpiece and the exposure pattern forming apparatus, with light of at least part of the exposure light via each of the plurality of exposure elements in the first state different from one another.

In the embodiment of the present disclosure, the sub-scanning axis may be an axis orthogonal to the main-scanning axis, and the control unit may repeat a relative movement of the workpiece and the exposure pattern forming apparatus along the main-scanning axis and a relative movement of the workpiece and the exposure pattern forming apparatus along the sub-scanning axis, and may sequentially irradiate each of a plurality of regions in the scheduled exposure region, in accordance with the relative movement of the workpiece and the exposure pattern forming apparatus, with light of at least part of the exposure light via each of the plurality of exposure elements in the first state different from one another, and thus an exposure amount may be integrated by irradiation of the light via the plurality of exposure elements in the first state different from one another in each of the plurality of regions to form an exposure region along an axis intersecting the main-scanning axis and the sub-scanning axis.

In the embodiment of the present disclosure, the control unit may relatively move the workpiece and the exposure pattern forming apparatus along a main-scanning axis; and may integrate an exposure amount in a region adjacent to the predetermined region along the main-scanning axis by sequentially irradiating the region adjacent to the predetermined region along the main-scanning axis in the scheduled exposure region with light of at least part of the exposure light via each of the plurality of exposure elements in the first state different from one another in accordance with the relative movement of the workpiece and the exposure pattern forming apparatus.

In the embodiment of the present disclosure, the control unit may control an integrated exposure amount between the predetermined region and a region adjacent to the predetermined region along the main-scanning axis, and thus may control an interval in the main-scanning axis between a pattern formed in the predetermined region through an exposure process with the exposure light to the region adjacent to the predetermined region along the main-scanning axis and a pattern formed in the region adjacent to the predetermined region along the main-scanning axis.

In the embodiment of the present disclosure, the control unit may integrate an exposure amount in a region adjacent to the predetermined region along the main-scanning axis by sequentially irradiating the region adjacent to the predetermined region along the main-scanning axis with light of at least part of the exposure light via each of the plurality of exposure elements in the first state different from one another, while relatively moving the workpiece and the exposure pattern forming apparatus.

In the embodiment of the present disclosure, the control unit may relatively move the workpiece and the exposure pattern forming apparatus along a main-scanning axis; and may sequentially irradiate a plurality of regions different from the predetermined region along the main-scanning axis in the scheduled exposure region, in accordance with the relative movement of the workpiece and the exposure pattern forming apparatus, with light of at least part of the exposure light via each of the plurality of exposure elements in the first state different from one another, and thus may integrate an exposure amount by irradiation of the light via the plurality of exposure elements in the first state different from one another in each of the plurality of regions to form an exposure region along the main-scanning axis.

In the embodiment of the present disclosure, the control unit may sequentially irradiate the plurality of regions along the main-scanning axis in the scheduled exposure region with light of at least part of the exposure light via each of the plurality of exposure elements in the first state different from one another while relatively moving the workpiece and the exposure pattern forming apparatus along the main-scanning axis, and thus may integrate an exposure amount by irradiation of the light via the plurality of exposure elements in the first state different from one another in each of the plurality of regions to form an exposure region along the main-scanning axis.

In the embodiment of the present disclosure, the control unit may relatively move the workpiece and the exposure pattern forming apparatus along a main-scanning axis, and may integrate an exposure amount in a region adjacent to the predetermined region by sequentially irradiating along a sub-scanning axis orthogonal to the main-scanning axis in the scheduled exposure region, in accordance with a relative movement of the workpiece and the exposure pattern forming apparatus along the main-scanning axis, with light of part of the exposure light via a third exposure element in the first state among the plurality of exposure elements and light of part of the exposure light via a fourth exposure element in the first state among the plurality of exposure elements, and the third exposure element and the fourth exposure element may be each an exposure element different from the first exposure element and the second exposure element.

In the embodiment of the present disclosure, the control unit may control an integrated exposure amount of the predetermined region and a region adjacent to the predetermined region along the sub-scanning axis, and thus may control an interval in the sub-scanning axis between a pattern formed in the predetermined region through an exposure process with the exposure light to the predetermined region and the region adjacent to the predetermined region along the sub-scanning axis and a pattern formed in the region adjacent to the predetermined region along the sub-scanning axis.

In the embodiment of the present disclosure, the control unit may switch at least part of exposure elements of the plurality of exposure elements to the first state or the second state in accordance with the relative movement of the workpiece and the exposure pattern forming apparatus, based on exposure pattern information including information regarding a position of the scheduled exposure region on the workpiece and information regarding an integrated exposure amount in each region of the scheduled exposure region.

In the embodiment of the present disclosure, the control unit may irradiate the predetermined region with light of part of the exposure light via the exposure element in the first state other than a defect exposure element among the plurality of exposure elements in accordance with a relative movement of the workpiece and the exposure pattern forming apparatus so that an integrated exposure amount of the predetermined region of the scheduled exposure region becomes a predetermined exposure amount based on information on the defect exposure element in the plurality of exposure elements.

In the embodiment of the present disclosure, in a case where at least one exposure element of a first portion of exposure elements among the plurality of exposure elements included in the exposure pattern forming apparatus is the defect exposure element, a second portion of exposure elements different from the first portion among the plurality of exposure elements is used for exposure so that an integrated exposure amount of the predetermined region may become the predetermined exposure amount instead of the defect exposure element.

In the embodiment of the present disclosure, the plurality of exposure elements may be two-dimensionally arrayed, part of the first portion and part of the second portion may be included in a same row among the plurality of exposure elements, and in a case where at least one of the exposure elements among part of the exposure elements of the first portion in the row is the defect exposure element, the control unit may irradiate the predetermined region, in accordance with a relative movement of the workpiece and the exposure pattern forming apparatus, with light of part of the exposure light via at least one of the exposure elements among part of the exposure elements of the second portion in the row instead of the defect exposure element.

In the embodiment of the present disclosure, the plurality of exposure elements may be two-dimensionally arrayed, a light detection unit may be further provided that detects an intensity distribution of light of at least part of the exposure light via at least part of the plurality of exposure elements, and the control unit may generate information on the defect exposure element including information regarding a position of the defect exposure element in the two-dimensional array based on the intensity distribution of light detected by the light detection unit.

An embodiment of the present disclosure may further include: a first exposure head including the exposure pattern forming apparatus and at least one optical element; and a second exposure head including the exposure pattern forming apparatus and at least one optical element, in which the control unit is configured to radiate light of part of the exposure light via at least one exposure element among a plurality of exposure elements of the exposure pattern forming apparatus in the first exposure head and to irradiate a first scheduled exposure region of a workpiece with light of at least part of the exposure light, the control unit is configured to radiate light of part of the exposure light via at least one exposure element among a plurality of exposure elements of an exposure pattern forming apparatus in the second exposure head and to irradiate a second scheduled exposure region of a workpiece with light of at least part of the exposure light, and the control unit may repeat a relative movement of the workpiece along a main-scanning axis and the first exposure head and the second exposure head, and a relative movement of the workpiece along a sub-scanning axis orthogonal to the main-scanning axis, and the first exposure head and the second exposure head, and may irradiate the first scheduled exposure region with light of at least part of the exposure light via at least one exposure element among a plurality of exposure elements of the exposure pattern forming apparatus in the first exposure head and may irradiate the second scheduled exposure region with light of at least part of the exposure light via at least one exposure element among a plurality of exposure elements of the exposure pattern forming apparatus in the second exposure head, sequentially in accordance with the relative movement of the workpiece, the first exposure head, and the second exposure head, and thus alternately arranges and forms a first exposure region and a second exposure region along the sub-scanning axis.

In the embodiment of the present disclosure, a plurality of the first exposure regions and a plurality of the second exposure regions may be provided, and any one of the second scheduled exposure regions may be positioned between two of the first scheduled exposure regions.

In the embodiment of the present disclosure, a plurality of the first exposure regions and a plurality of the second exposure regions may be provided, and the one first scheduled exposure region may be adjacent to another first scheduled exposure region to form a first scheduled exposure region group, and any one first scheduled exposure region group may be positioned between two of the second scheduled exposure regions.

In order to further clarify the above-described features and advantages of the present disclosure, detailed content has been described above with reference to examples together with the drawings.

What is claimed is:

1. An exposure apparatus comprising:

a light source configured to emit exposure light;

an exposure pattern forming apparatus disposed on an optical path of at least part of the exposure light; and a controller electrically connected to the exposure pattern forming apparatus, wherein the exposure pattern forming apparatus includes a plurality of exposure elements, at least one exposure element of the plurality of exposure elements is configured to irradiate a scheduled exposure region of a workpiece with light of the at least part of the exposure light, and the controller is configured to:

control whether the workpiece is irradiated with the exposure light via each of the exposure elements by switching each of the exposure elements to a first state or to a second state; and integrate an exposure amount in a predetermined region of the scheduled exposure region by sequentially irradiating the predetermined region with (i) light of part of the exposure light via a first exposure element-in-the-first-state among the plurality of exposure elements, the first exposure element being in the first state, and (ii) light of part of the exposure light via a second exposure element among the plurality of exposure elements, the second exposure element being in the first state and being different from the first exposure element, in accordance with a relative movement of the workpiece and the exposure pattern forming apparatus, the exposure apparatus further comprising:

a collimating optical system configured to collimate light of at least part of the exposure light from the exposure pattern forming apparatus;

an objective optical system configured to concentrate light of at least part of the exposure light exiting the collimating optical system toward the workpiece; and a driving apparatus configured to displace part of optical members of the collimating optical system along an axis intersecting an optical axis of the objective optical system.

2. The exposure apparatus according to claim 1, wherein the plurality of exposure elements is two-dimensionally arrayed, and the first exposure element and the second exposure element are exposure elements different from each other in a same row among the plurality of exposure elements.

3. The exposure apparatus according to claim 1, wherein the controller is configured to control an integrated exposure amount in the predetermined region of the scheduled exposure region based on a number of exposure elements in the first state that sequentially irradiate the predetermined region with light of part of the exposure light in accordance with a relative movement of the workpiece and the exposure pattern forming apparatus.

4. The exposure apparatus according to claim 3, wherein the controller is configured to control an integrated exposure time in the predetermined region based on the number of exposure elements in the first state.

5. The exposure apparatus according to claim 1, wherein the controller is configured to control a width of a pattern formed in the predetermined region through an exposure process by the exposure light to the predetermined region by controlling an integrated exposure amount in the predetermined region.

6. The exposure apparatus according to claim 1, wherein a light amount of a center part in a region where the scheduled exposure region is irradiated with light of part of the exposure light via an exposure element of the plurality of exposure elements is larger than a light amount of a peripheral part in the irradiated region.

7. The exposure apparatus according to claim 6, wherein the exposure pattern forming apparatus is a digital mirror device, and the exposure element is a mirror element having a reflection surface configured to reflect light of part of the exposure light.

8. The exposure apparatus according to claim 1, wherein the controller integrates the exposure amount in the predetermined region of the scheduled exposure region by sequentially irradiating the predetermined region with light of part of the exposure light via the first exposure element in the first state and light of part of the exposure light via the second exposure element in the first state while relatively moving the workpiece and the exposure pattern forming apparatus.

9. The exposure apparatus according to claim 1, wherein the controller is configured to:

integrate the exposure amount in the predetermined region by sequentially irradiating the predetermined region with light of part of the exposure light via the first exposure element in the first state and light of part of the exposure light via the second exposure element in the first state in accordance with a relative movement along a main-scanning axis of the workpiece and the exposure pattern forming apparatus; and further control the driving apparatus to displace the part of optical members of the collimating optical system along an axis intersecting the optical axis so that part of a region of the scheduled exposure region along a sub-scanning axis intersecting the main-scanning axis with respect to the predetermined region is irradiated with light of at least part of the exposure light via at least one exposure element of the plurality of exposure elements.

10. The exposure apparatus according to claim 9, wherein the sub-scanning axis is an axis orthogonal to the main-scanning axis, and the controller is configured to:

repeat displacement of the part of optical members of the collimating optical system along an axis intersecting the optical axis and a relative movement of the workpiece and the exposure pattern forming apparatus along the main-scanning axis; and sequentially irradiate each of a plurality of regions in the scheduled exposure region, in accordance with the relative movement of the workpiece and the exposure pattern forming apparatus, with light of at least part of the exposure light via each of the plurality of exposure elements in the first state different from one another, and thus an exposure amount is integrated by irradiation of the light via the plurality of exposure elements in the first state different from one another in each of the plurality of regions to form an exposure region along an axis intersecting the main-scanning axis and the sub-scanning axis.

11. The exposure apparatus according to claim 1, wherein the plurality of exposure elements of the exposure pattern forming apparatus are two-dimensionally arrayed, and the driving apparatus is configured to displace the part of optical members of the collimating optical system along an axis intersecting the optical axis so that an irradiation position of light of at least part of the exposure light is displaced at an irradiation interval smaller than an irradiation interval of light of at least part of the exposure light in the scheduled exposure region corresponding to an interval between adjacent exposure elements two-dimensionally arrayed.

12. The exposure apparatus according to claim 1, wherein the controller is configured to:

relatively move the workpiece and the exposure pattern forming apparatus along a main-scanning axis;

further relatively move the workpiece and the exposure pattern forming apparatus along a sub-scanning axis intersecting the main-scanning axis; and integrate an exposure amount by sequentially irradiating a partial region of the scheduled exposure region along the sub-scanning axis with respect to the predetermined region, in accordance with a relative movement along the sub-scanning axis of the workpiece and the exposure pattern forming apparatus, with light of at least part of the exposure light via each of the plurality of exposure elements in the first state different from one another.

13. The exposure apparatus according to claim 12, wherein the sub-scanning axis is an axis orthogonal to the main-scanning axis, and the controller is configured to:

repeat a relative movement of the workpiece and the exposure pattern forming apparatus along the main-scanning axis and a relative movement of the workpiece and the exposure pattern forming apparatus along the sub-scanning axis; and sequentially irradiate each of a plurality of regions in the scheduled exposure region, in accordance with the relative movement of the workpiece and the exposure pattern forming apparatus, with light of at least part of the exposure light via each of the plurality of exposure elements in the first state different from one another, and thus an exposure amount is integrated by irradiation of the light via the plurality of exposure elements in the first state different from one another in each of the plurality of regions to form an exposure region along an axis intersecting the main-scanning axis and the sub-scanning axis.

14. The exposure apparatus according to claim 1, wherein the controller is configured to:

relatively move the workpiece and the exposure pattern forming apparatus along a main-scanning axis; and integrate an exposure amount in a region adjacent to the predetermined region along the main-scanning axis by sequentially irradiating the region adjacent to the predetermined region along the main-scanning axis in the scheduled exposure region with light of at least part of the exposure light via each of the plurality of exposure elements in the first state different from one another, in accordance with the relative movement of the workpiece and the exposure pattern forming apparatus.

15. The exposure apparatus according to claim 14, wherein the controller is configured to control an integrated exposure amount between the predetermined region and the region adjacent to the predetermined region along the main-scanning axis, and is configured to control an interval in the main-scanning axis between a pattern formed in the predetermined region through an exposure process with the exposure light to the region adjacent to the predetermined region along the main-scanning axis and a pattern formed in the region adjacent to the predetermined region along the main-scanning axis.

16. The exposure apparatus according to claim 14, wherein the controller is configured to integrate an exposure amount in the region adjacent to the predetermined region along the main-scanning axis by sequentially irradiating the region adjacent to the predetermined region along the main-scanning axis with light of at least part of the exposure light via each of the plurality of exposure elements in the first state different from one another, while causing the relative movement of the workpiece and the exposure pattern forming apparatus.

17. The exposure apparatus according to claim 1, wherein the controller is configured to:

relatively move the workpiece and the exposure pattern forming apparatus along a main-scanning axis; and sequentially irradiate a plurality of regions different from the predetermined region along the main-scanning axis in the scheduled exposure region, in accordance with the relative movement of the workpiece and the exposure pattern forming apparatus, with light of at least part of the exposure light via each of the plurality of exposure elements in the first state different from one another, and integrate an exposure amount by irradiation of the light via the plurality of exposure elements in the first state different from one another in each of the plurality of regions to form an exposure region along the main-scanning axis.

18. The exposure apparatus according to claim 1, wherein the controller is configured to:

relatively move the workpiece and the exposure pattern forming apparatus along a main-scanning axis; and integrate an exposure amount in a region adjacent to the predetermined region by sequentially irradiating along a sub-scanning axis orthogonal to the main-scanning axis in the scheduled exposure region, in accordance with a relative movement of the workpiece and the exposure pattern forming apparatus along the main-scanning axis, with light of part of the exposure light via a third exposure element in the first state among the plurality of exposure elements and light of part of the exposure light via a fourth exposure element in the first state among the plurality of exposure elements, and the third exposure element and the fourth exposure element are each an exposure element different from the first exposure element and the second exposure element.

19. The exposure apparatus according to claim 18, wherein the controller is configured to control an integrated exposure amount between the predetermined region and a region adjacent to the predetermined region along the sub-scanning axis, and is configured to control an interval in the sub-scanning axis between a pattern formed in the predetermined region through an exposure process with the exposure light to the predetermined region and the region adjacent to the predetermined region along the sub-scanning axis and a pattern formed in the region adjacent to the predetermined region along the sub-scanning axis.

20. The exposure apparatus according to claim 1, wherein the controller is configured to switch at least part of exposure elements of the plurality of exposure elements to the first state or the second state in accordance with the relative movement of the workpiece and the exposure pattern forming apparatus, based on exposure pattern information including information regarding a position of the scheduled exposure region on the workpiece and information regarding an integrated exposure amount in each region of the scheduled exposure region.

21. The exposure apparatus according to claim 1, wherein the controller is configured to irradiate the predetermined region with light of part of the exposure light via the exposure element in the first state other than a defect exposure element among the plurality of exposure elements in accordance with a relative movement of the workpiece and the exposure pattern forming apparatus so that an integrated exposure amount of the predetermined region of the scheduled exposure region becomes a predetermined exposure amount based on information on the defect exposure element in the plurality of exposure elements.

22. The exposure apparatus according to claim 21, wherein, in a case where at least one exposure element of a first portion of exposure elements among the plurality of exposure elements included in the exposure pattern forming apparatus is the defect exposure element, a second portion of exposure elements different from the first portion among the plurality of exposure elements is used for exposure so that an integrated exposure amount of the predetermined region becomes the predetermined exposure amount instead of the defect exposure element.

23. The exposure apparatus according to claim 21, wherein the plurality of exposure elements are two-dimensionally arrayed, part of the first portion and part of the second portion are included in a same row among the plurality of exposure elements, and in a case where at least one of the exposure elements among part of the exposure elements of the first portion in the row is the defect exposure element, the controller is configured to irradiate the predetermined region, in accordance with a relative movement of the workpiece and the exposure pattern forming apparatus, with light of part of the exposure light via at least one of the exposure elements among part of the exposure elements of the second portion in the row instead of the defect exposure element.

24. The exposure apparatus according to claim 21, wherein the plurality of exposure elements are two-dimensionally arrayed, a light detection unit is further provided that is configured to detect an intensity distribution of light of at least part of the exposure light via at least part of the plurality of exposure elements, and the controller is configured to generate information on the defect exposure element including information regarding a position of the defect exposure element in the two-dimensional array, based on the intensity distribution of light detected by the light detection unit.

25. The exposure apparatus according to claim 1 further comprising:

a first exposure head including the exposure pattern forming apparatus and at least one first optical element; and a second exposure head including the exposure pattern forming apparatus and at least one second optical element, wherein the controller is configured to radiate light of part of the exposure light via at least one exposure element among a plurality of exposure elements of the exposure pattern forming apparatus in the first exposure head and to irradiate a first scheduled exposure region of a workpiece with light of at least part of the exposure light, the controller is configured to radiate light of part of the exposure light via at least one exposure element among a plurality of exposure elements of an exposure pattern forming apparatus in the second exposure head and is configured to irradiate a second scheduled exposure region of a workpiece with light of at least part of the exposure light, and the controller is configured to:

repeat a relative movement of the workpiece along a main-scanning axis and the first exposure head and the second exposure head, and a relative movement of the workpiece along a sub-scanning axis orthogonal to the main-scanning axis and the first exposure head and the second exposure head; and irradiate the first scheduled exposure region with light of at least part of the exposure light via at least one exposure element among a plurality of exposure elements of the exposure pattern forming apparatus in the first exposure head and irradiate the second scheduled exposure region with light of at least part of the exposure light via at least one exposure element among a plurality of exposure elements of the exposure pattern forming apparatus in the second exposure head, sequentially in accordance with the relative movement of the workpiece, the first exposure head, and the second exposure head, and thus alternately arrange and form a first exposure region and a second exposure region along the sub-scanning axis.

26. The exposure apparatus according to claim 25, wherein a plurality of the first exposure regions and a plurality of the second exposure regions are provided, and any one of the second scheduled exposure regions is positioned between two of the first scheduled exposure regions.

27. The exposure apparatus according to claim 25, wherein a plurality of the first exposure regions and a plurality of the second exposure regions are provided, and the one first scheduled exposure region is adjacent to the another first scheduled exposure region to form a first scheduled exposure region group, and any one first scheduled exposure region group is positioned between two of the second scheduled exposure regions.

* * * * *